United States Patent
Fujii et al.

(10) Patent No.: US 7,486,159 B2
(45) Date of Patent: Feb. 3, 2009

(54) SURFACE ACOUSTIC WAVE DEVICE

(75) Inventors: Yasuhisa Fujii, Kanazawa (JP); Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 285 days.

(21) Appl. No.: 10/568,114

(22) PCT Filed: Jul. 12, 2005

(86) PCT No.: PCT/JP2005/012871

§ 371 (c)(1),
(2), (4) Date: Feb. 13, 2006

(87) PCT Pub. No.: WO2006/009021

PCT Pub. Date: Jan. 26, 2006

(65) Prior Publication Data

US 2007/0018756 A1   Jan. 25, 2007

(30) Foreign Application Priority Data

Jul. 23, 2004 (JP) .............................. 2004-216137
Oct. 8, 2004 (JP) .............................. 2004-295988

(51) Int. Cl.
*H03H 9/00* (2006.01)
*H03H 9/64* (2006.01)
*H01L 41/04* (2006.01)

(52) U.S. Cl. ..................................... 333/193; 333/195

(58) Field of Classification Search ................. 333/193, 333/195, 133
See application file for complete search history.

(56) References Cited

U.S. PATENT DOCUMENTS

| 5,592,135 | A * | 1/1997 | Taguchi et al. ............... 333/193 |
| 7,116,189 | B2 | 10/2006 | Takamine |
| 2003/0107454 | A1 | 6/2003 | Nakamura et al. |
| 2003/0183884 | A1 | 10/2003 | Miyazawa |
| 2004/0066115 | A1 | 4/2004 | Takamine |
| 2004/0080385 | A1 | 4/2004 | Takamine et al. |
| 2004/0196119 | A1* | 10/2004 | Shibahara et al. ........... 333/193 |
| 2005/0064657 | A1 | 3/2005 | Miyazawa |

FOREIGN PATENT DOCUMENTS

| DE | 10343296 A1 | 4/2004 |
| EP | 0 998 039 A1 | 5/2000 |
| EP | 1315297 A2 | 5/2003 |
| EP | 1453198 A2 | 9/2004 |
| JP | 05-167387 | 7/1993 |

(Continued)

OTHER PUBLICATIONS

Official communication issued in the corresponding Korean Application No. 10-2006-7004317, mailed on Jan. 26, 2007.

(Continued)

*Primary Examiner*—Dean O Takaoka
(74) *Attorney, Agent, or Firm*—Keating & Bennett, LLP

(57) ABSTRACT

A surface acoustic wave device includes a substrate, a plurality of terminals including at least an unbalanced terminal and balanced terminals, and at least one of surface acoustic wave element disposed between the unbalanced terminal and the two balanced terminals. Different signal lines connected to the same surface acoustic wave element intersect through insulating films.

15 Claims, 23 Drawing Sheets

FOREIGN PATENT DOCUMENTS

| | | |
|---|---|---|
| JP | 05-235684 | 9/1993 |
| JP | 06-152310 | 5/1994 |
| JP | 06-044231 U | 6/1994 |
| JP | 07-030362 | 1/1995 |
| JP | 10-70435 | 3/1998 |
| JP | 10-256862 | 9/1998 |
| JP | 11-191722 | 7/1999 |
| JP | 2000-049567 | 2/2000 |
| JP | 2000-138553 | 5/2000 |
| JP | 2002-271168 | 9/2002 |
| JP | 2002-300004 | 10/2002 |
| JP | 2003-204243 | 7/2003 |
| JP | 2003-234636 | 8/2003 |
| JP | 2003-297926 | 10/2003 |
| JP | 2004-048670 | 2/2004 |
| JP | 2004-88551 | 3/2004 |
| JP | 2004-96244 | 3/2004 |
| JP | 2004-129224 | 4/2004 |
| JP | 2004-282707 | 10/2004 |
| WO | 00/69069 A1 | 11/2000 |

OTHER PUBLICATIONS

Official communication issued in counterpart Chinese Application No. 200580000823.3, issued on Jun. 6, 2008.

International Search Report for PCT Application No. PCT/JP2005/012871, mailed Oct. 25, 2005.

Official communication issued in the counterpart German Application No. 112005000043.0, mailed on Jul. 10, 2007.

* cited by examiner

SURFACE ACOUSTIC WAVE DEVICE

BACKGROUND OF THE INVENTION

1. Field of the Invention

The present invention relates to a surface acoustic wave device, and more particularly, to a surface acoustic wave device including a surface acoustic wave element.

2. Description of the Related Art

In a conventional balanced-type SAW (surface acoustic wave) filter having an unbalanced-to-balanced-type filter of a first stage and a balanced-to-balanced-type filter of a second stage that are cascade-connected, signal wirings for connecting the balanced terminals of the filters are disposed between the stages and a ground pad connected to the other terminal of an unbalanced terminal IDT (interdigital transducer, comb-shaped electrode) of the first stage is disposed between the signal wirings.

FIG. 5 is a top view of a substrate of a surface acoustic wave device of a related example. The substrate 1210 is a LiTaO₃ single crystal substrate and, a metal film having a fixed pattern is provided on the main surface 1212, as shown in FIG. 5. That is, a balanced-type SAW filter is provided, in which a longitudinally coupled resonator-type surface acoustic wave filter 1220 of the first stage and a longitudinally coupled resonator-type surface acoustic wave filter 1230 of the second stage are cascade-connected, a pad 1251 defines an unbalanced terminal, and pads 1252 and 1253 define balanced terminals. In an area enclosed by the filters 1220 and 1230 and wirings 1241 and 1242 for cascade-connecting the filters 1220 and 1230, a ground pad 1256 connected to an IDT 1223 including the unbalanced terminal 1251 is disposed (see, for example, Japanese Unexamined Patent Application Publication No. 2002-300004).

Furthermore, in recent years, there has been a requirement for having a balanced-to-unbalanced conversion function or a so-called balun function included in a surface acoustic wave filter used in the RF stage of a portable telephone. Lately, in particular, a longitudinally coupled resonator-type surface acoustic wave filter which provides a high-frequency wave and also which provides a balanced-to-unbalanced conversion function has become more common as a bandpass filter of the RF stage of a portable telephone.

The surface acoustic wave filter having a balanced-to-unbalanced conversion function is connected to a mixer IC (hereinafter, referred to as a balanced-type mixer IC) having a balanced or differential input and output. When this balanced-type mixer IC is used, the effect of noise is reduced and the output is stabilized. Thus, this surface acoustic wave filter is often used to improve the characteristics of portable telephones.

A surface acoustic wave filter having a balanced-to-unbalanced conversion function may include various structures. Each of the various structures has benefits and detriments and may be properly used in accordance with the intended uses and requirements. One known structure includes balanced terminals that are connected to both terminals of one IDT.

For example, in FIG. 6, an element chip 30 of such a surface acoustic wave filter is schematically shown. The surface acoustic wave filter is configured to have a balanced-to-unbalanced conversion function such that both ends of the middle IDT 1 of a longitudinally coupled resonator-type surface acoustic wave filter element 6 including three IDTs 1, 2, and 3 and two reflectors 4 and 5 are connected to balanced signal terminals 11 and 12, respectively, and such that one end of each of the left and right IDTs 2 and 3 is connected to an unbalanced signal terminal 13 through an IDT 7 of a surface acoustic wave resonator 10 in which reflectors 8 and 9 are disposed on either side of the IDT 7. In the surface acoustic wave filter, the other ends of the IDTs 2 and 3 are connected to a ground terminal.

The element chip 30 is housed in a package which can be divided into an upper portion and a lower portion in the bottom-side portion. FIG. 7 shows the upper surface of the upper portion 33 of the package bottom portion 31 in which the element chip 30 is mounted, FIG. 8 shows the upper surface of the lower portion 36 of the package bottom portion 31, and FIG. 9 shows the lower surface (bottom surface of the package) of the lower portion 36 of the package bottom portion 31.

As shown in FIG. 7, wiring patterns (lands) 42 to 45 are exposed in the die attachment portion 41 of the upper portion 33 of the package bottom portion 31 and bump-connected to the terminals (pads) of the element chip 30 by a bump 39, shown by a white circle in FIGS. 6 and 7. In FIG. 7, via holes 46 and 47, shown by black circles, pass through the upper portion 33 of the package bottom portion 31 and the wiring patterns 45 and 44 and wiring patterns 61 and 63 of the lower portion 36 shown in FIG. 8 are connected. Among external terminals shown in FIG. 9, the right middle external terminal 56 is an unbalanced signal terminal, the left upper and lower external terminals 52 and 53 are balanced signal terminals, and the other external terminals 54 and 55 are ground terminals. The external terminal 56 defining an unbalanced signal terminal is connected to the unbalanced signal wiring pattern 42 through a castellation 48. The external terminals 52 and 53 defining balanced signal terminals are connected to the balanced signal wiring patterns 43 and 44 through castellations 49 and 50.

Finally, corresponding to the locations of the first and second balanced signal terminals (pads) 11 and 12 on the element chip 30 shown in FIG. 6, as shown in FIG. 7, in the flip-chip mounting package of the element chip 30, the first balanced signal terminal wiring pattern (pad) 43 is disposed in the middle of one side of the package, and the second balanced signal terminal wiring pattern (land) 44 is disposed in the corner portion close to the first balanced signal terminal wiring pattern (land) 43. In the element chip 30, a signal line 1a connecting one end of the IDT 1 and a first balanced signal terminal 11 and a signal line 1b connecting the other end of the balanced ITD 1 and a second balanced signal terminal 12 are asymmetrically disposed, and thus, the balancing is deteriorated. Then, as shown in FIG. 9, the external terminals 52 and 53 as the first and second balanced signal terminals are disposed so as to be symmetrical around the central axis of the package, and the balancing is adjusted by altering the path difference in the package between a signal line connected to the external terminal 52 defining the first balanced signal terminal and a signal line connected to the external terminal 53 defining the second balanced signal terminal (see, for example, Japanese Unexamined Patent Application Publication No. 2002-271168).

The surface acoustic wave filter package shown in FIGS. 6 to 9 can be also used for mounting an element chip 60 including two longitudinally coupled resonator-type surface acoustic wave filter elements 66 and 68 having three IDTs 66a, 66b, and 66c, and 68a, 68b, and 68c and two reflectors 66s and 66t, and 68s and 68t, respectively, as shown in FIG. 22. That is, the element chip 30 shown in FIG. 1 and the element chip 60 shown in FIG. 22 have the same external dimensions and the same terminal (pad) configuration.

In Japanese Unexamined Patent Application Publication No. 2003-204243, a float balanced-type surface acoustic wave filter in which the balancing is improved such that two terminals extending on either side in the direction perpendicular to the surface acoustic wave propagation direction of the middle ITD of a longitudinally coupled resonator-type surface acoustic wave filter element are connected to balanced signal terminals, IDTs on both sides are connected to unbalanced signal terminals by using two unbalanced signal lines, and one balanced signal line and one unbalanced signal line intersect in three dimensions through an insulating film is disclosed.

As in the related example shown in FIG. 5, when two elements are cascade-connected and a ground pad is disposed between stages, since stray capacitance between the wiring for the cascade connection and the ground pad is large, there is a problem in that the insertion loss in the passband is large.

Furthermore, in a surface acoustic wave filter having a balanced-to-unbalanced conversion function which includes balanced signal terminals that are connected to the terminals on both sides of one IDT as disclosed in Japanese Unexamined Patent Application Publication No. 2002-271168), since the structure of the package is complicated and specific, the configuration of the package is limited to the element structure.

Accordingly, for example, a surface acoustic wave filter 70 shown in FIG. 10 includes two longitudinally coupled resonator-type filter elements 71 and 72 having three IDTs 71*a*, 71*b*, and 71*c*, and 72*a*, 72*b*, and 72*c* and two reflectors 71*s* and 71*t*, and 72*s* and 72*t* that are cascade-connected, one end of the middle IDT 71*a* of one longitudinally coupled resonator-type filter element 71 is connected to an unbalanced terminal 73, and one end (one bus bar) of the middle IDT 72*a* of the other longitudinally coupled resonator-type filter element 72 is divided into two bus bars and the two bus bars are connected to balanced signal terminals 74 and 75.

Another surface acoustic wave filter 80 shown in FIG. 11 includes two sets of surface acoustic wave filter elements 81, 82, 83, and 84 having three IDTs 81*a*, 81*b*, and 81*c*; 82*a*, 82*b*, and 82*c*; 83*a*, 83*b*, and 83*c*; and 84*a*, 84*b*, and 84*c* and two reflectors 81*s* and 81*t*; 82*s* and 82*t*; 83*s* and 83*t*; and 84*s* and 94*t* that are cascade-connected, one end of each of the middle IDTs 81*a* and 83*a* of the surface acoustic wave filter elements 81 and 83 is connected to balanced terminals 85 and 86, and one end of each of the other surface acoustic wave filter elements 82 and 84 is connected to an unbalanced terminal 87. However, with this configuration, other surface acoustic wave filters cannot share the package with a surface acoustic wave filter having a balanced-to-unbalanced conversion function of another structure different in terms of the way surface acoustic wave elements are coupled.

Moreover, since the signal lines inside the package are asymmetrical, the affect of parasitic capacitance, is different between balanced signal terminals, and, as a result, there is a problem in that the balancing between balanced signal terminals is deteriorated.

In a surface acoustic wave filter in Japanese Unexamined Patent Application Publication No. 2002-204243, an intersection is performed by providing a balanced signal line on a piezoelectric substrate and providing an unbalanced signal line on an insulating film disposed on the balanced signal line. Accordingly, the difference between the parasitic capacitance and bridge capacitance entering the two balanced signal terminals increases and the balancing cannot be sufficiently improved.

SUMMARY OF THE INVENTION

To overcome the problems described above, preferred embodiments of the present invention provide a surface acoustic wave device including two cascade-connected elements in which insertion loss in the passband is greatly reduced, and a surface acoustic wave filter which can be housed in a common package with a surface acoustic wave filter having another configuration, and which has greatly improved balancing between balanced signal terminals. That is, preferred embodiments of the present invention provide a surface acoustic wave device in which the characteristics are greatly improved.

A surface acoustic wave device according to a preferred embodiment of the present invention includes a substrate, a plurality of terminals disposed on the substrate and including at least an unbalanced terminal and two balanced terminals, and at least one surface acoustic wave element disposed between the unbalanced terminal and the balanced terminals on the substrate. In this surface acoustic wave device, different signal lines connected to the same surface acoustic wave element intersect through an insulating film.

The substrate may be a piezoelectric substrate in which the entire substrate is made of a piezoelectric material or a piezoelectric substrate in which a thin film of piezoelectric material (piezoelectric thin film) is disposed on the main body of a substrate made of non-piezoelectric material. In the latter case, a piezoelectric thin film is provided in at least the portion of a surface acoustic wave element. A balanced signal is input to or output from a balanced terminal and an unbalanced signal is input to or output from an unbalanced terminal.

When different signal lines connected to the surface acoustic wave elements intersect through an insulating film, the length of the signal lines is reduced as compared to when the signal lines are disposed so as not to intersect, and the restrictions on the locations of the signal lines are greatly reduced.

In this manner, for example, when a balanced type surface acoustic wave filter is constructed by connecting two surface acoustic wave elements using signal lines, the insertion loss is reduced such that the lengths of the signal lines extending between the surface acoustic wave elements are shortened by reducing the space between the two surface acoustic wave elements, and by not providing pads between the surface acoustic wave elements.

Furthermore, with the signal lines extending between the surface acoustic wave elements and the signal lines extending between the surface acoustic wave elements and the terminals, since the restrictions on the locations of the lines are reduced, it is easier to provide a package for common use.

Preferably, the insulating film is polyimide. Since the relative dielectric constant of the polyimide is sufficiently small as compared to the relative dielectric constant of the piezoelectric substrate, stray capacitance is reduced.

According to a first preferred embodiment, at least two of the surface acoustic wave elements are provided. One of the two surface acoustic wave elements defines a first element which is connected to the unbalanced terminal and a ground terminal so as to be grounded with different signal lines. The other of the two surface acoustic wave elements defines a second element. At least two signal lines define signal wirings for connecting the second element and the first element. At least one of the signal wirings and the signal line defining a ground wiring arranged to connect the ground terminal and the first element intersect through the insulating film. The ground terminal is disposed outside an area enclosed by the first element, the second element, and the signal wirings.

In the related device, the ground terminal is disposed inside an area enclosed by the first element, the second element, and the signal wirings and the insertion loss in the passband is thereby increases. However, according to the above-described configuration, the stray capacitance between the ground terminal and the signal lines is minimized and, as a result, the insertion loss in the passband is greatly reduced due to the ground terminal being disposed outside an area enclosed by the first element, the second element, and the signal wirings.

Preferably, the first element includes three IDTs disposed in a propagation direction of a surface acoustic wave, and the unbalanced terminal and the ground terminal are connected to the middle IDT of the three IDTs. The second element includes three IDTs disposed in the propagation direction of a surface acoustic wave, and two balanced terminals are connected to the middle IDT of the three IDTs. The IDTs on either side of the middle IDT of the first element and the IDTs on either side of the middle IDT of the second element are connected by the signal wirings.

According to the above configuration, the insertion loss in the passband of a balanced type SAW filter in which the longitudinally coupled resonator-type SAW filter elements (first element and second element) are cascade connected is greatly reduced.

Preferably, two sets of the first element, the signal wirings, and the second element are provided on the substrate. The first element of each set includes three IDTs disposed in the propagation direction of a surface acoustic wave, and the unbalanced terminal and the ground terminal are connected to the middle IDT of the three IDTS. The second element of each set includes one IDT connected to one of the balanced terminals different from that in the other sets. In each set, the two signal wirings connect the IDTs on either side of the first element and the IDT of the second element. The first elements of the two sets are in opposite phase to each other.

According to the above configuration, the longitudinally coupled resonator-type SAW filter (first element) connected to a balanced pad and the one-port SAW resonator (second element) are connected in series, two sets of these are connected in parallel, the longitudinally coupled resonator-type SAW filter (first element) is arranged to be in opposite phase, and the one-port SAW resonator (second element) is used as a trap. Thus, in a balanced type SAW filter having filter characteristics improved, the insertion loss in the passband is greatly reduced.

Preferably, the ground wiring includes a first layer that is not disposed in the vicinity of the insulating film and a second layer that is disposed on the vicinity of the insulating film.

According to the above-described structure, regarding the ground wiring, since two layers are disposed one on top of another around the insulating film, the ground residual impedance is decreased and the attenuation outside the band is improved. Furthermore, the signal wiring may include only one layer, because two layers are not required to be disposed one on another around the insulating film, the signal wiring is shortened, and the size is reduced by shortening the distance between the first element and the second element.

According to a second preferred embodiment, at least two surface acoustic wave elements are connected to each other. One of the two surface acoustic wave elements (hereinafter, referred to as a first surface acoustic wave element) is a longitudinally coupled resonator-type surface acoustic wave element having three IDTs disposed along the propagation direction of a surface acoustic wave, and the middle IDT of the three IDTs is connected to the two balanced signal terminals through the two signal lines (hereinafter, referred to as first and second signal lines). The two balanced signal terminals are disposed on either side of the central axis of the substrate substantially in parallel to the direction in which the two surface acoustic wave elements are arranged. At least one of the first and second signal lines is disposed on the insulating film formed on the substrate.

In the above-described structure, when at least one of the first and second signal lines and the signal line connecting between the surface acoustic wave elements intersect, in this intersecting portion, a three-dimensional intersection is provided through an insulating film.

According to the above-described structure, the package can be commonly used by arranging the balanced signal terminals at the same locations as in a surface acoustic wave filter having another different configuration for coupling the surface acoustic wave element. Furthermore, regarding the parasitic capacitance and bridge capacitance entering each of the two balanced signal terminals, the difference between them is reduced by disposing the signal lines connected to the balanced signal terminals on an insulating film and thus, the balancing can be improved.

Preferably, the two balanced signal terminals are disposed so as to be substantially symmetrical around the central axis of the substrate.

According to the above-described structure, since the balanced signal terminals are disposed substantially in the same location as in a surface acoustic wave filter having another configuration in which the balanced signal terminals are symmetrically disposed, a common package can be used.

Preferably, the second surface acoustic wave element is disposed in the propagation direction of a surface acoustic wave and is a longitudinally coupled resonator-type surface acoustic wave filter element having three IDTs cascade-connected to the first surface acoustic wave element.

According to the above-described structure, the attenuation outside the passband can be increased.

Preferably, the second surface acoustic wave element is one or a plurality of surface acoustic wave resonator elements connected together.

According to the above-described structure, the attenuation outside the passband is further increased.

According to a third preferred embodiment, the surface acoustic wave element is a longitudinally coupled resonator-type surface acoustic wave filter element including three IDTs disposed along the propagation direction of a surface acoustic wave, and the middle IDT of the three IDTs is connected to the two balanced terminals through the signal lines (hereinafter, referred to as first and second signal lines). The two balanced signal terminals are disposed on both sides of the central axis of the substrate substantially perpendicular to the propagation direction of a surface acoustic wave. At least one of the first and second signal lines is disposed on the insulating film.

In the above-described structure, when at least one of the first and second signal lines intersects the signal line and the connection line connecting between the IDT and the terminals excluding the balanced terminals, in this intersecting portion, a three-dimensional intersection is provided through an insulating film.

According to the above-described structure, a common package can be used by arranging the balanced signal terminals at the same locations as in a surface acoustic wave filter having another configuration in the mode for coupling the surface acoustic wave elements. Furthermore, regarding the parasitic capacitance and bridge capacitance entering each of the two balanced signal terminals, the difference between them is reduced by disposing the signal lines connected to the balanced signal terminals on an insulating film and thus, the balancing is improved.

In a surface acoustic wave device of the present invention, the characteristics are improved. For example, in the first preferred embodiment, the insertion loss in the passband is reduced. Furthermore, in the second and third preferred embodiments, the difference of parasitic capacitance entering each balanced signal terminal is reduced as compared to the structure described in Japanese Unexamined Patent Application Publication No. 2002-271168, and the balancing between the balanced signal terminals is improved. Furthermore, it is possible to use a common package with a surface acoustic wave filter having a balanced-to-unbalanced conversion function with other configurations as shown in FIG. 10, FIG. 11, and accordingly, it is unnecessary to produce different packages for exclusive use.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Hereinafter, the preferred embodiments of the present invention are described with reference to FIGS. 1 to 23.

First and second preferred embodiments are described with reference to FIGS. 1 to 4.

First Preferred Embodiment

Figure 1:
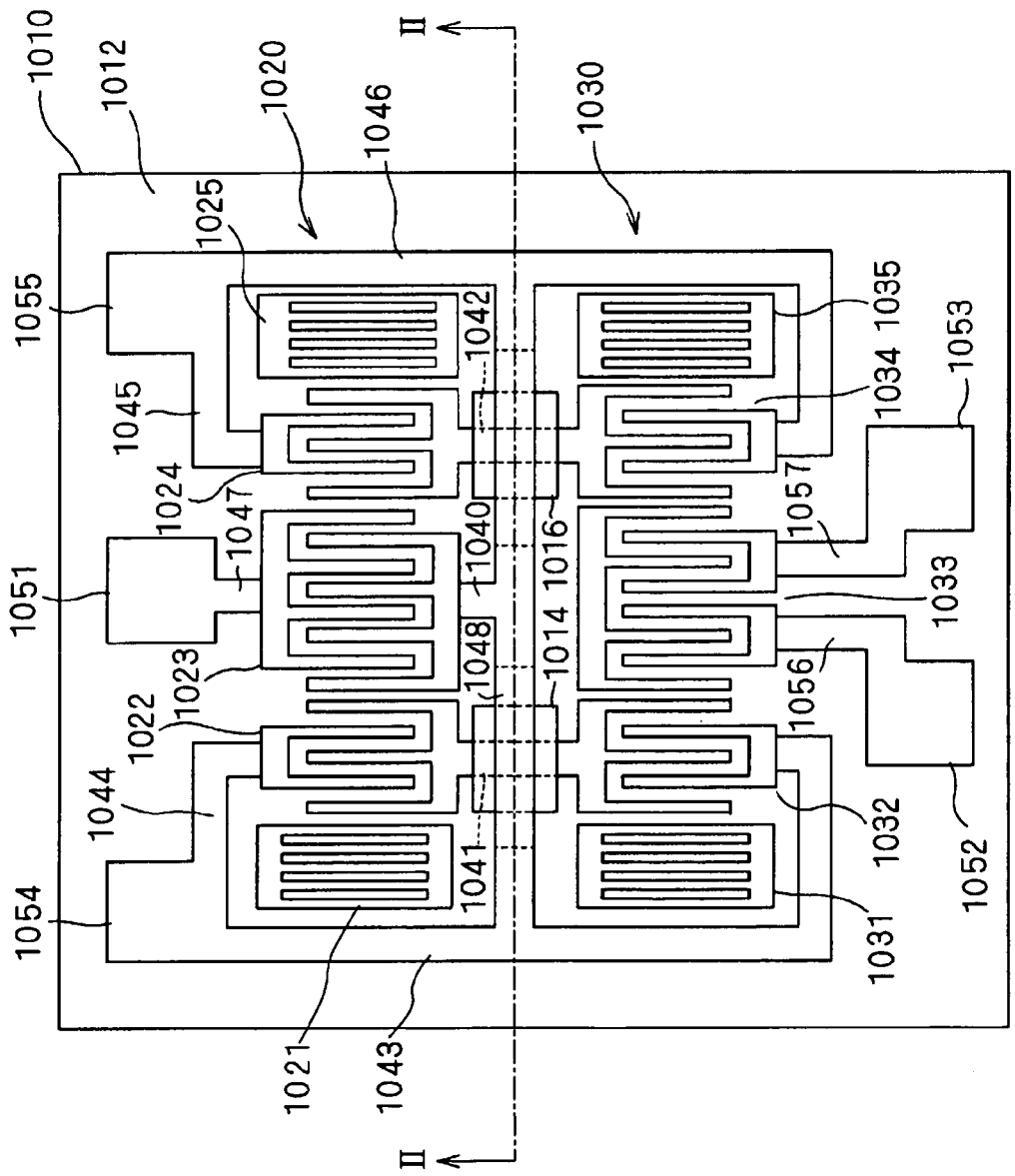
FIG. 1 is a top view of a balanced type SAW filter according to a first preferred embodiment of the present invention.

A surface acoustic wave device according to the first preferred embodiment is described with reference to FIGS. 1 and 2. FIG. 1 is a top view of a substrate 1010 in the surface acoustic wave device of the first preferred embodiment, and FIG. 2 is a sectional view taken along line II-II of FIG. 1.

The surface acoustic wave device according to the first preferred embodiment is preferably an EGSM receiving band filter. For example, the input impedance is about 50 Ω, the output impedance is about 150 Ω, the pass frequency band is about 925 to about 960 MHz, and the center frequency is about 942.5 MHz.

Figure 2:
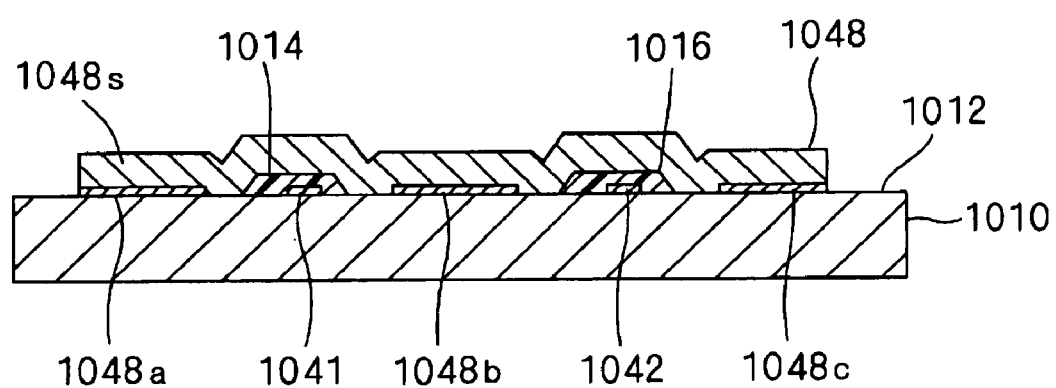
FIG. 2 is a sectional view taken on line II-II of FIG. 1.

The substrate 1010 is preferably made of a $LiTaO_3$ single crystal piezoelectric substrate and a metal film having a fixed pattern is provided on the main surface 1012 of the substrate 1010 as shown in FIG. 2. That is, a balanced-type SAW filter is provided in which a longitudinally coupled resonator-type surface acoustic wave filter 1020 (hereinafter, referred to as a filter 1020) of a first stage and a longitudinally coupled resonator-type surface acoustic wave filter 1030 (hereinafter, referred to as a filter 1030) of a second stage are cascade-connected, a pad 1051 is an unbalanced terminal, and pads 1052 and 1053 are balanced terminals. Signal wirings 1041 and 1042, by which the filter 1020 and the filter 1030 are cascade-connected, intersect a ground wiring 1048 connected to an IDT 1023 including the unbalanced terminal 1051 in three dimensions. The ground wiring 1048 is connected to ground pads 1054 and 1055 which are disposed away from the space between the stages. The ground pads 1054 and 1055 are ground terminals for grounding. The filters 1020 and 1030 are disposed in parallel such that the propagation direction of the surface acoustic waves is parallel to each other.

In the filter 1020 of the first stage, three IDTs 1022, 1023, and 1024 are disposed in line with the propagation direction of a surface acoustic wave and two reflectors 1021 and 1025 are disposed on either side of the IDTs 1022, 1023, and 1024. One electrode side of the middle IDT 1023 is connected to the pad 1051 as an unbalanced terminal through a wiring 1047. The other electrode side is connected to the ground pads 1054 and 1055 via the wirings 1040 and 1048 through wirings 1043 and 1046. The sides of one electrode of the other IDTs 1022 and 1024 are also connected to the ground pads 1054 and 1055 through wirings 1044 and 1045.

In the filter 1030 of the second stage, three IDTs 1032, 1033, and 1034 are disposed in line in the propagation direction of a surface acoustic wave and two reflectors 1031 and 1035 are disposed on either side of the IDTs 1032, 1033, and 1034.

One electrode side of the middle IDT 1033 is connected to the pads 1052 and 1053 defining balanced terminals and the other electrode is a floating electrode. The sides of one electrode of the IDTs 1032 and 1034 disposed on either side of the IDT 1033 are connected to the sides of the other electrode of the IDTs 1022 and 1024 of the filter of the first stage. The sides of the other electrode of the IDTs 1032 and 1034 are connected to the ground pads 1054 and 1055 through wirings 1043 and 1046.

Rectangular insulating films 1014 and 1016 are arranged so as to cover portions of the wirings 1041 and 1042 of a signal line connecting the filters 1020 and 1030, the wiring 1048 is disposed on the insulating films 1014 and 1016, and the wirings 1041 and 1042 and the wiring 1048 intersect one another in three dimensions with the insulating films 1014 and 1016 disposed therebetween.

In the measurements of the insulating films 1014 and 1016, the dimension in the transverse direction (in the extending direction of the wiring 1048) in the drawing is about 50 μm, the dimension in the longitudinal direction (in the extending direction of the wirings 1041 and 1042) in the drawing is about 40 to about 50 μm, and the thickness is about 2 μm. The width of the lower wirings 1041 and 1042 is about 30 μm and the width of the upper wiring 1048 is about 20 μm to about 30 μm where the wirings intersect in three dimensions. The space between the filters 1020 and 1030 is about 60 to about 70 μm. The dimensions of the ground pads 1054 and 1055 are about 100 μm× about 100 μm. In the related example in which the ground pads having the same dimensions are disposed between the two cascade-connected longitudinally coupled resonator-type surface acoustic wave filters, since the distance between the filters is about 200 μm, in the first preferred embodiment, the distance between the filter elements is reduced so as to be about one third or less than that in the related example. A photosensitive resin (e.g., polyimide having a relative dielectric constant of about 2) is preferably used for the insulating films 1014 and 1016, for example.

In the first preferred embodiment, when the wiring 1048 (also referred to as a ground wiring 1048) for the connection of the ground pads 1054 and 1055 and the wirings 1041 and 1042 (also referred to as signal wirings 1041 and 1042) for the connection between the filters 1020 and 1030 intersect, the intersecting area seen from the top is sufficiently small, the relative dielectric constant of the insulating films 1014 and 1016 is sufficiently small as compared to the relative dielectric constant of the LiTaO$_3$ substrate 1010 which is about 50, and the thickness of the insulating films 1014 and 1016 is sufficiently large. Accordingly, the stray capacitance is reduced as compared to the structure in which two elements are cascade-connected and ground pads are disposed between the stages, as in the related example.

Next, the manufacturing method for the substrate 1010 is described.

First, an aluminum film pattern of the first layer is formed on the main surface 1012 of the substrate 1010 by dry etching or lift-off, for example. The aluminum film pattern of the first layer substantially matches the final metal pattern of the IDTs, pads and wirings. However, as shown in FIG. 2, regarding the wiring 1048, the pattern of the first layer is not formed in the portion where the insulating films 1014 and 1016 are formed and in the vicinity thereof such that the insulating layers 1014 and 1016 may be disposed between the first layers 1048a, 1048b, and 1048c. The thickness of the aluminum film of the first layer is approximately the same as the film thickness of the IDTs 1022 to 1024 and 1032 to 1034 and, for example, the thickness in an 800 MHz band SAW filter is about 300 nm to about 400 nm and the thickness in a 2 GHz band SAW filter is about 150 nm to about 200 nm.

Next, a photosensitive resin is coated and the insulating films 1014 and 1016 are formed in the intersecting portion of the wirings 1041 and 1042 between the filters 1020 and 1030 and the ground wiring 1048 using photolithography, for example.

Next, a resist mask having an opening corresponding to the final metal film pattern excluding the exposed portion of the filters 1020 and 1030 and the wirings 1041 and 1042 is formed and the aluminum film pattern of the second layer is formed using lift-off, for example. Ti or NiCr as an adhesive layer may be formed between the aluminum of the first layer and the substrate 1010 or between the aluminum of the second layer and the aluminum of the first layer.

In this manner, as shown in FIG. 2, the second layer 1048s of the wiring 1048 is disposed on top of the first layers 1048a, 1048b, and 1048c and connected thereto. In the connection portion between the second layer 1048s and the first layers 1048a, 1048b, and 1048c, the connection portion must have a fixed area or an area greater than that required to sufficiently reduce the connection resistance between the second layer 1048s and the first layers 1048a, 1048b, and 1048c. Accordingly, in the wiring 1048, the overlapping area between the first layers 1048a, 1048b, and 1048c and the second layer 1048s is at least about 20 μm per side.

The upper wiring (second layer) of the three-dimensional intersection must be connected to the first layer connected to the IDTs at a specific location. When the signal line for connecting the two elements is disposed on the upper side of the three-dimensional intersection, a connection portion for connecting the first layer and the second layer is required between one of the two elements and the three-dimensional intersection and between the other of the two elements and the three-dimensional intersection. That is, the distance between the two elements must be increased in order to include not only the insulating film of the three-dimensional intersection, but also the connection portion between the first layer and the second layer.

On the other hand, when the signal lines (wirings 1041 and 1042) for connecting the two elements (filters 1020 and 1030) are disposed on the lower side of the three-dimensional intersection as in the first preferred embodiment, since it is not necessary to provide the connection portion between the elements and the three-dimensional intersection, the distance between the two elements is dependent upon only the dimensions of the insulating film of the three-dimensional intersection.

In particular, in the first preferred embodiment, the middle IDT 1033 in the second stage is divided and configured to be connected with a balanced output (or balanced input) and no ground wiring is required in the middle IDT 1033 in the second stage. Accordingly, regarding the ground wirings between the filters 1020 and 1030, only the ground wiring 1048 for the middle IDT 1023 in the first stage is required.

In the first preferred embodiment, the signal wirings 1041 and 1042 between the filters 1020 and 1030 are provided only in the first layer and the electric resistivity of the lines is increased. However, the distance between the filters 1020 and 1030 is reduced and the deterioration of the insertion loss in the band is, thus, prevented.

In the surface acoustic wave device of the first preferred embodiment, the stray capacitance between the signal line and the ground pads is reduced by the movement of the ground pads 1054 and 1055 from between the filters 1020 and 1030 and the insertion loss in the passband is decreased by reducing the between-stage distance (that is, reducing the length of the signal wirings 1041 and 1042 between the filters 1020 and 1030).

Second Preferred Embodiment

Figure 3:
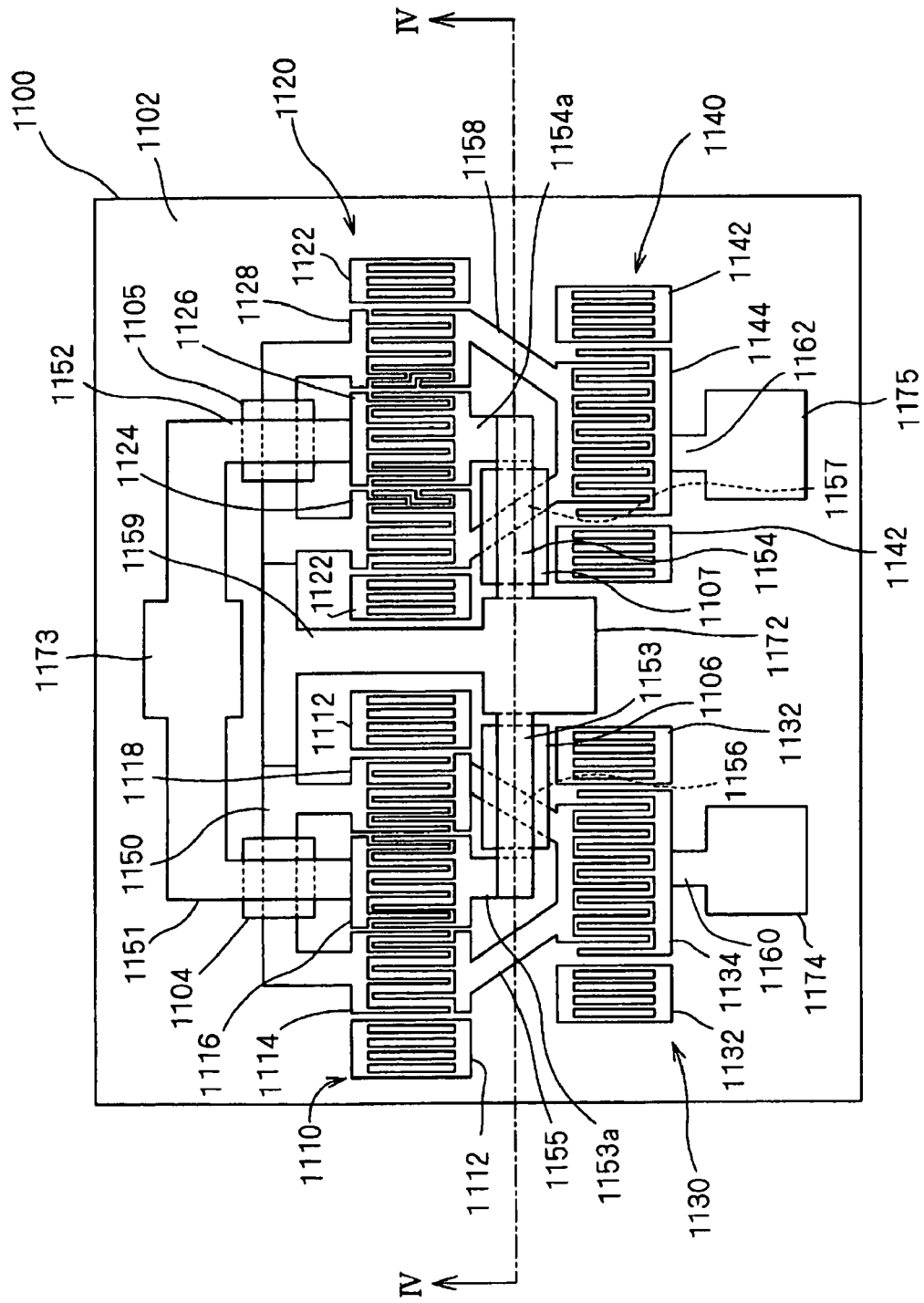
FIG. 3 is a top view of a balanced type SAW filter according to a second preferred embodiment of the present invention.
Figure 4:
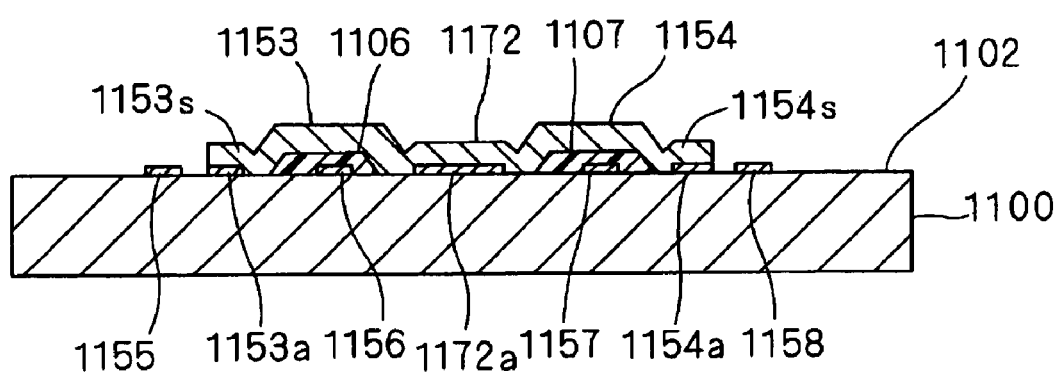
FIG. 4 is a sectional view taken on line IV-IV of FIG. 3.
Figure 5:
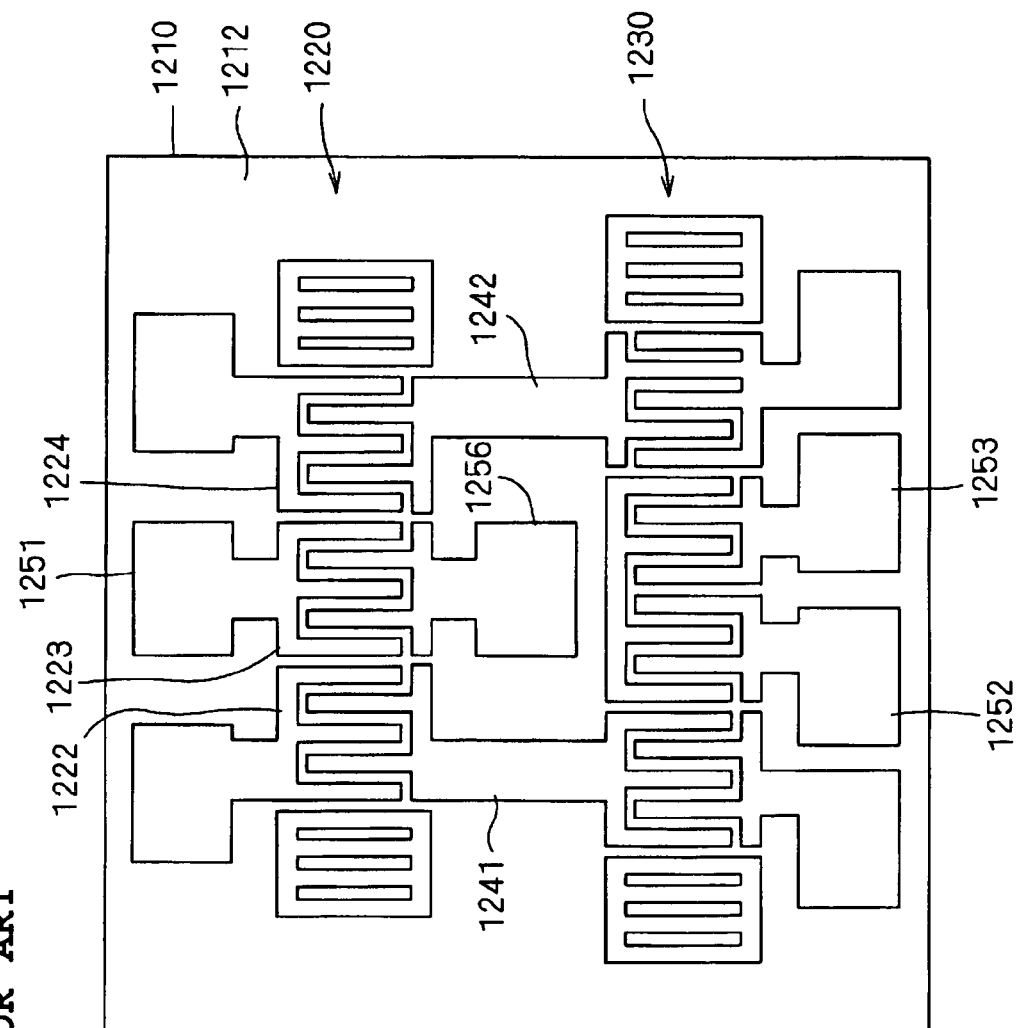
FIG. 5 is a top view of a balanced type SAW filter according to the related art.
Figure 6:
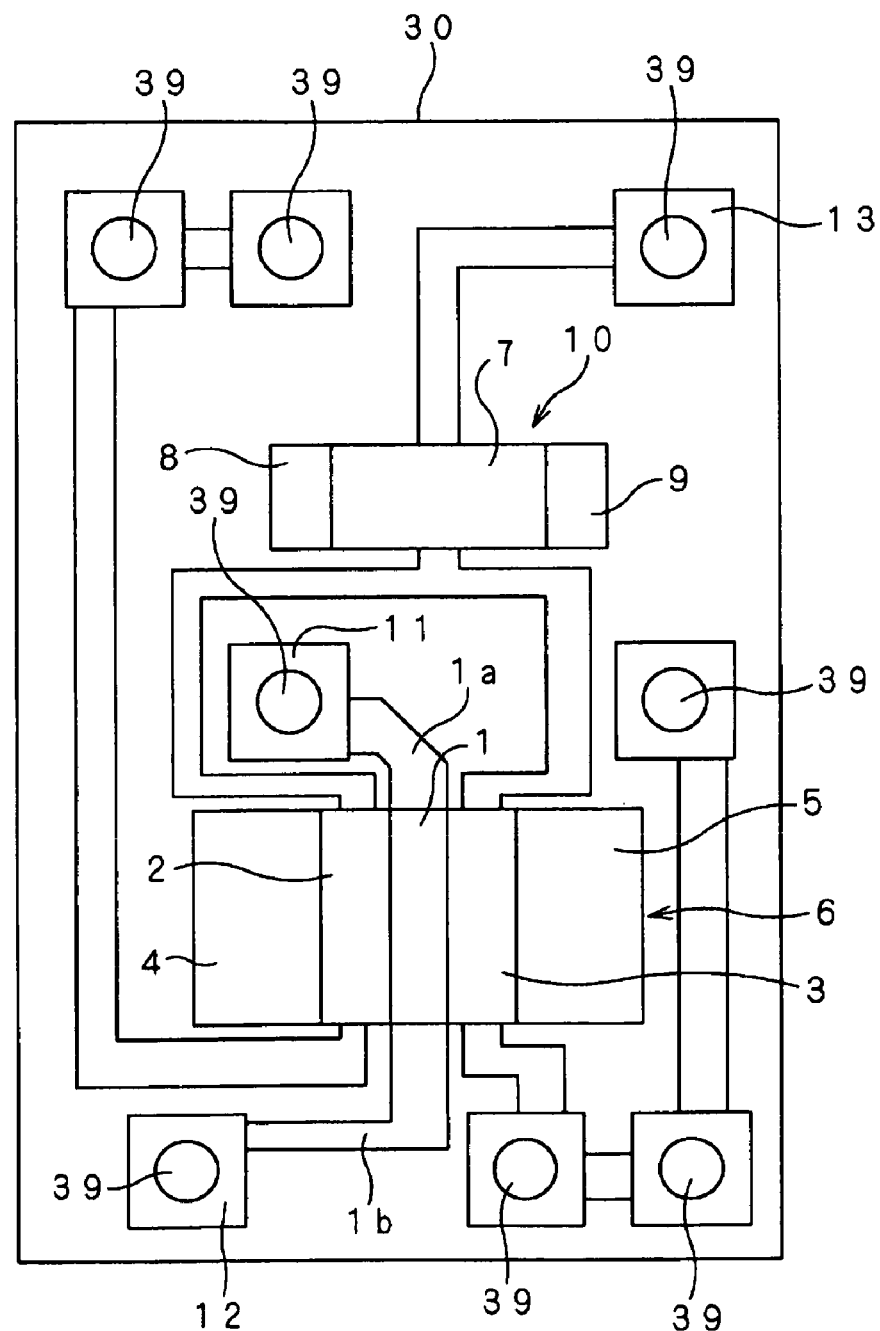
FIG. 6 shows the structure of a piezoelectric substrate according to the related art.
Figure 7:
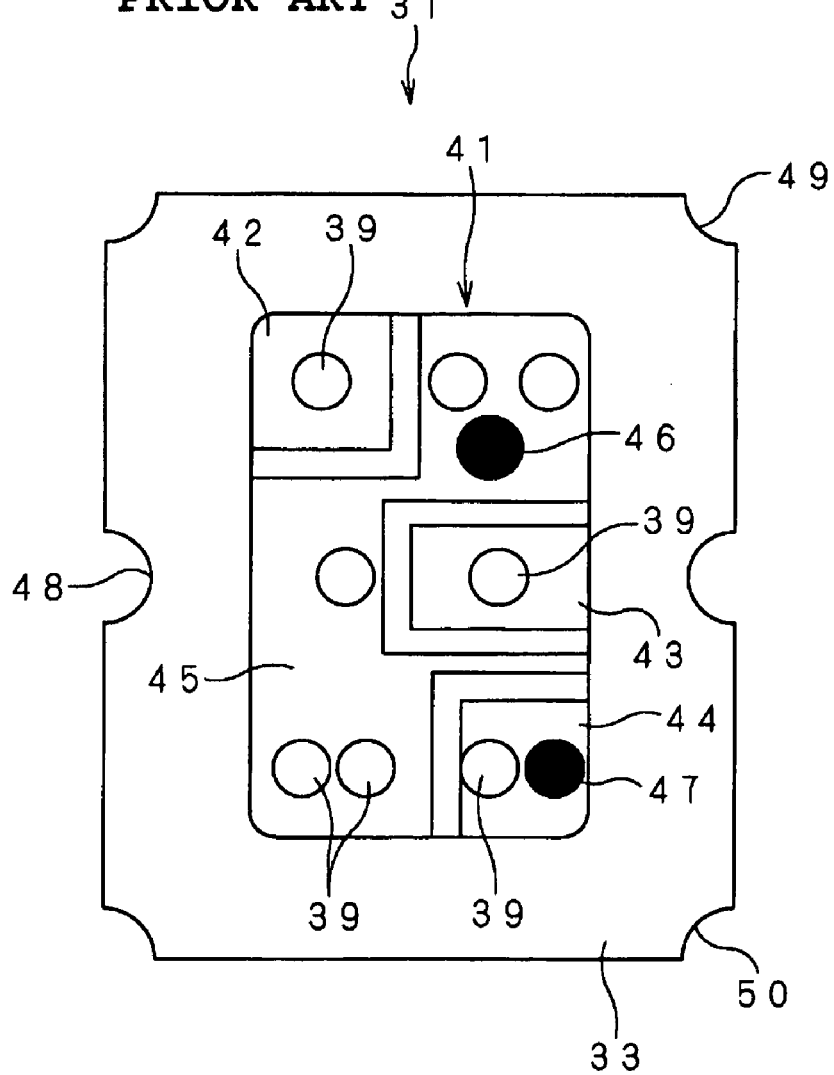
FIG. 7 is a top view of the upper portion of a package shown in FIG. 6.
Figure 8:
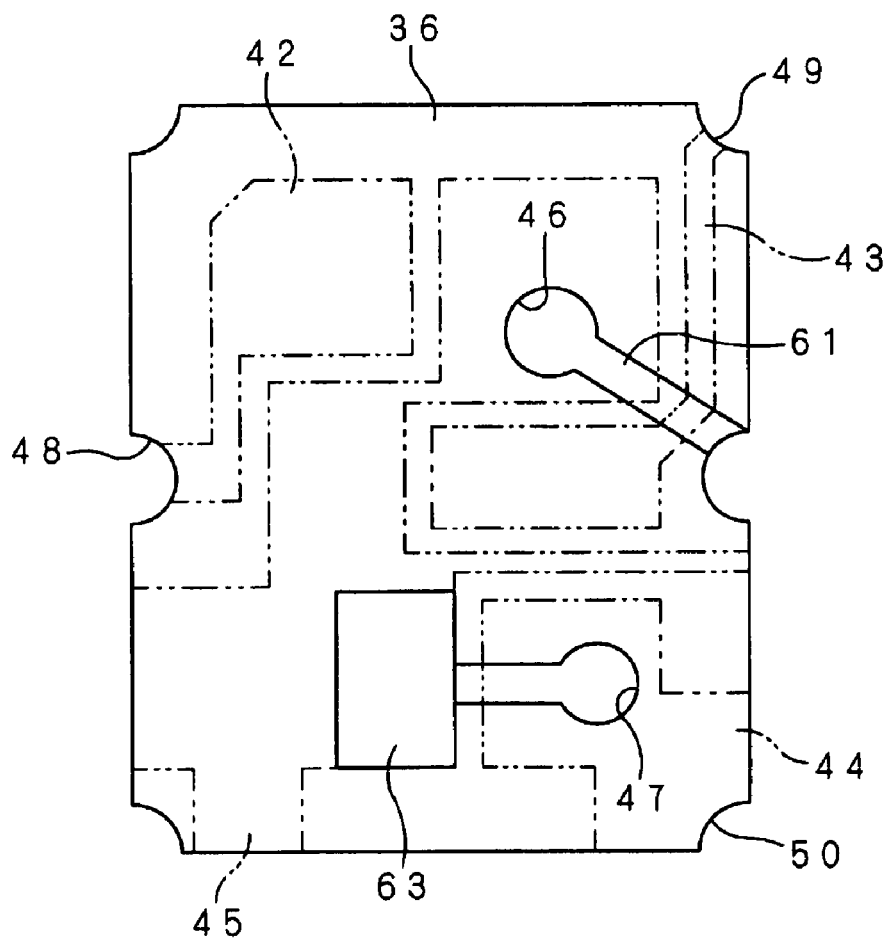
FIG. 8 is a top view of the lower portion of a package shown in FIG. 6.
Figure 9:
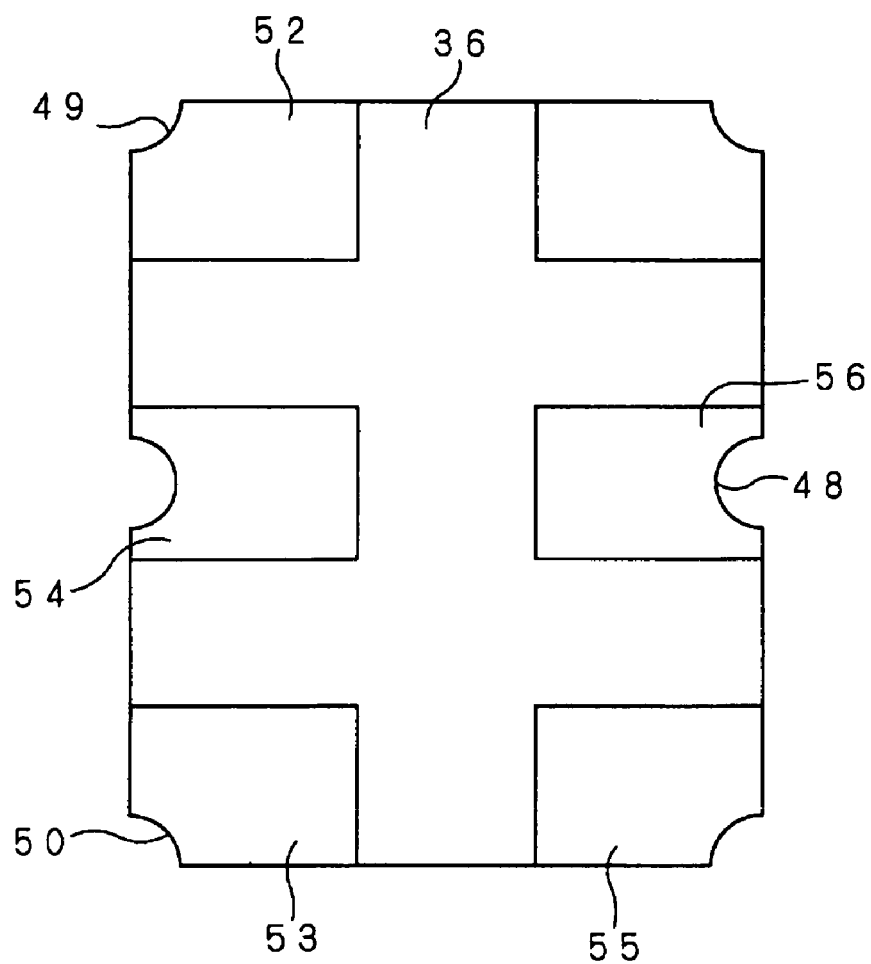
FIG. 9 shows the bottom surface of a package shown in FIG. 6.
Figure 10:
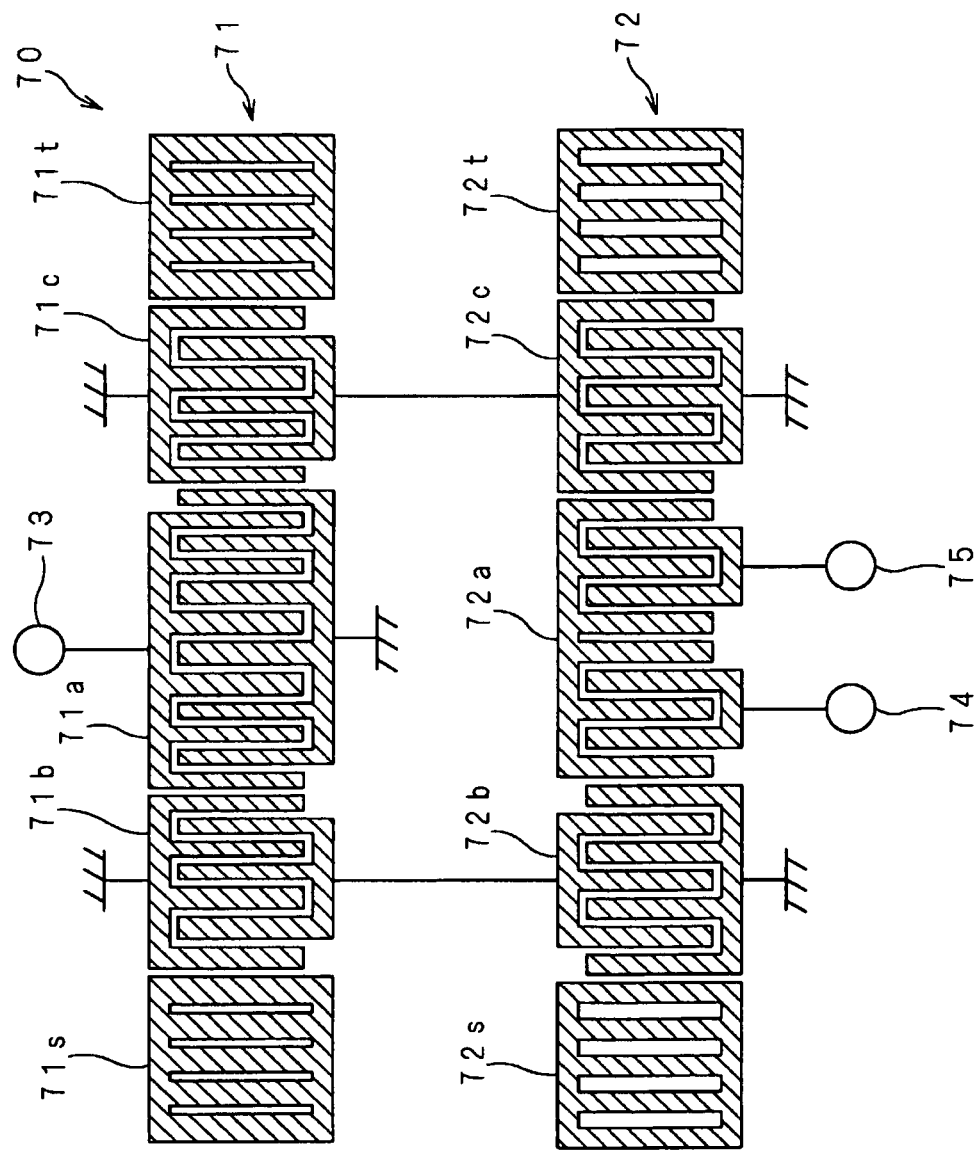
FIG. 10 shows the structure of a surface acoustic wave filter according to the related art.
Figure 11:
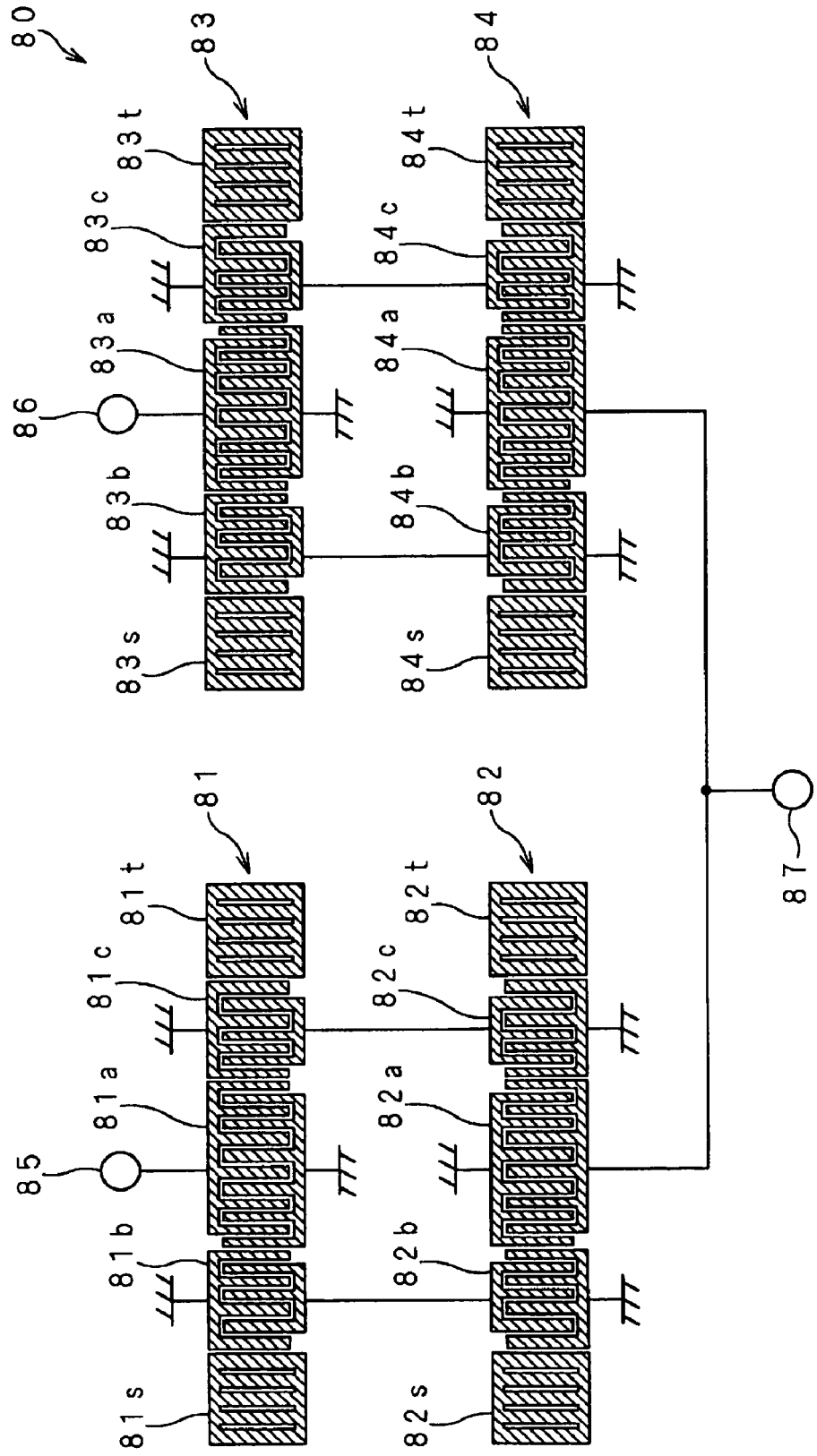
FIG. 11 shows the structure of a surface acoustic wave filter according to a reference example.

Next, a surface acoustic wave device according to a second preferred embodiment of the present invention is described with reference to FIGS. 3 and 4. FIG. 3 is a top view of a substrate 1100 in the surface acoustic wave device of the second preferred embodiment, and FIG. 4 is a sectional view taken on line IV-IV of FIG. 3.

The surface acoustic wave device of the second preferred embodiment is a device in which the substrate 1100 having a metal film of a fixed pattern disposed on the main surface 1102 is housed in a package (not illustrated), and may be manufactured by the same method as in the first preferred embodiment. Hereinafter, the differences between the first preferred embodiment and the second preferred embodiment are primarily described.

The surface acoustic wave device of the second preferred embodiment is preferably a DCS receiving band surface acoustic wave filter. For example, the input impedance is about 50 Ω, the output impedance is about 150 Ω, and the pass frequency band is about 1805 MHz to about 1880 MHz.

As shown in FIG. 3, two sets of longitudinally coupled resonator-type SAW filters 1110 and 1120 (hereinafter, also referred to as filters 1110 and 1120) defining first elements are connected in parallel to a pad 1173 defining an unbalanced terminal, and pads 1174 and 1175 define balanced terminals. One-port SAW resonators 1130 and 1140 (hereinafter, referred to as traps 1130 and 1140) defining second elements are connected in series to the filters 1110 and 1120.

The two-element cascade connection in the longitudinally coupled resonator-type SAW filters as in the first preferred embodiment has the advantage that high attenuation is achieved outside the passband, but it is at a disadvantage in that the insertion loss in the passband is increased. As in the second preferred embodiment, high attenuation is achieved in the vicinity of the passband by the series connection of the one-port SAW resonators 1130 and 1140 to the longitudinally coupled resonator-type SAW filters 1110 and 1120. The one-port SAW resonators 1130 and 1140 are used as traps where an antiresonant frequency is located on the higher frequency side of the passband of the resonator-type SAW filters 1110 and 1120.

In the filters 1110 and 1120, three IDTs 1114, 1116, and 1118; and 1124, 1126, and 1128 are disposed in line in the propagation direction of a surface acoustic wave, and two reflectors 1112 and 1122 are disposed on both sides of the IDTs, respectively. One electrode side of the middle IDTs 1116 and 1126 is connected to a pad 1173 defining an unbalanced terminal through wirings 1151 and 1152, respectively. The other electrode sides are connected to a ground pad 1172 as a ground terminal through wirings 1153a and 1153, and 1154a and 1154. One electrode side of the other IDTs 1114 and 1118, and 1124 and 1128 is also connected to the ground pad 1172 through wirings 1150 and 1159.

The filter 1110 is opposite in phase to the filter 1120. Furthermore, in the IDTs 1124 and 1128 of one filter 1120, the intersection is weighted so as to provide adjustment of the balancing.

In the traps 1130 and 1140, reflectors 1132 and 1142 are disposed on both sides of the IDTs 1134 and 1144. One electrode side of the IDTs 1134 and 1144 is connected to the other electrode side of the IDTs 1114 and 1118, and 1124 and 1128 of the filters 1110 and 1120 through wirings 1155 and 1156, and 1157 and 1158, respectively. The other electrode sides of the IDTs 1134 and 1144 are connected to pads 1174 and 1175 defining balanced terminals through wirings 1160 and 1162, respectively.

The wirings 1156 and 1157 intersect the wirings 1153 and 1154 in three dimensions with insulating films 1106 and 1107 disposed therebetween. Furthermore, the wirings 1151 and 1152 also intersect the wiring 1150 with the insulating films 1104 and 1105 disposed therebetween.

As for the dimensions of the insulating films 1104, 1105, 1106, and 1107, the dimension in the transverse direction (extending direction of the wirings 1150, 1153, and 1154) in FIG. 3 is about 70 μm, the dimension in the longitudinal direction (extending direction of the wirings 1151 and 1152 and perpendicular to the extending direction of the wirings 1153 and 1154) in FIG. 3 is about 40 to about 50 μm, and the thickness is about 2 μm. The width of the lower wirings 1150, 1156, and 1157 in the three dimensional intersection is about 30 μm and the width of the upper wirings 1151, 1152, 1153, and 1154 is about 20 μm to about 30 μm. The space between the filters 1110 and 1120 and the traps 1130 and 1140 is about 60 μm to about 70 μm. The dimensions of the ground pad 1172 are about 100 μm× about 100 μm. In the related example where the ground pad of the same dimensions is disposed between the filter and the trap, the space between the filter and the trap is about 200 μm, and, in the second preferred embodiment, the space between the filters 1110 and 1120 and the traps 1130 and 1140 is about one third or less than that in the related example.

As shown in FIG. 4, second layers 1153s and 1154s of the wirings 1153 and 1154 are disposed on the insulating layers 1106 and 1107, and the second layers 1153s and 1154s are disposed on the first layer 1172a of the ground pad 1172 and wirings 1153a and 1154a of only the first layer on the both sides of the insulating films 1106 and 1107. The first layer is disposed on the second layer in an area of at least about 20 μm per side and both are connected.

Moreover, the second layer is formed in the pads 1172, 1173; 1174, and 1175, the middle portion of the wiring 1150, and the wirings 1151, 1152, 1153, 1154, 1159, 1160, and 1162.

In the second preferred embodiment, the three dimensional wiring is provided between the filters 1110 and 1120 and the traps 1130 and 1140, but the same effect as in the first preferred embodiment may be obtained. That is, since the space between the two elements of the filters 1110 and 1120 and the traps 1130 and 1140 can be determined by only the dimensions of the insulating films 1106 and 1107 for three dimensional intersection, the space is relatively small.

Since no ground wiring is required in the traps 1130 and 1140, only one ground wiring is required between the two elements for grounding the filters 1110 and 1120. Even if the wirings 1155 and 1156, and 1157 and 1158 between the two elements are provided by only the first layer and the electric resistivity of the lines increases, since the distance between the two elements is reduced, the deterioration of the insertion loss in the band is prevented.

Next, third to seventh preferred embodiments are described with reference to FIGS. 12 to 21 and FIG. 23. Moreover, in the drawings, the same reference numerals are given to the same structure elements as described above.

Third Preferred Embodiment

A surface acoustic wave filter according to a third preferred embodiment is described with reference to FIGS. 12 to 19 and FIG. 22. The surface acoustic wave filter of the third preferred embodiment includes a balanced-to-unbalanced conversion function. Here, an EGSM (extended global system for mobile communications) receiving filter in which the impedance of an unbalanced signal terminal is about 50 Ω and the impedance of a balanced signal terminal is about 100 Ω is described as an example.

First, the structure of the third preferred embodiment is described with reference to FIGS. 12 and 13.

In the surface acoustic wave filter of the third preferred embodiment, two longitudinally coupled resonator-type surface acoustic wave filter elements (hereinafter, referred to as filter elements) 101 and 102 are provided on a piezoelectric substrate 100 and cascade connected. A LiTaO$_3$ 40 ±5° Y-cut X-propagation substrate is preferably used as the piezoelectric substrate 100 and the filter elements 101 and 102 are defined by aluminum electrodes.

Figure 12:
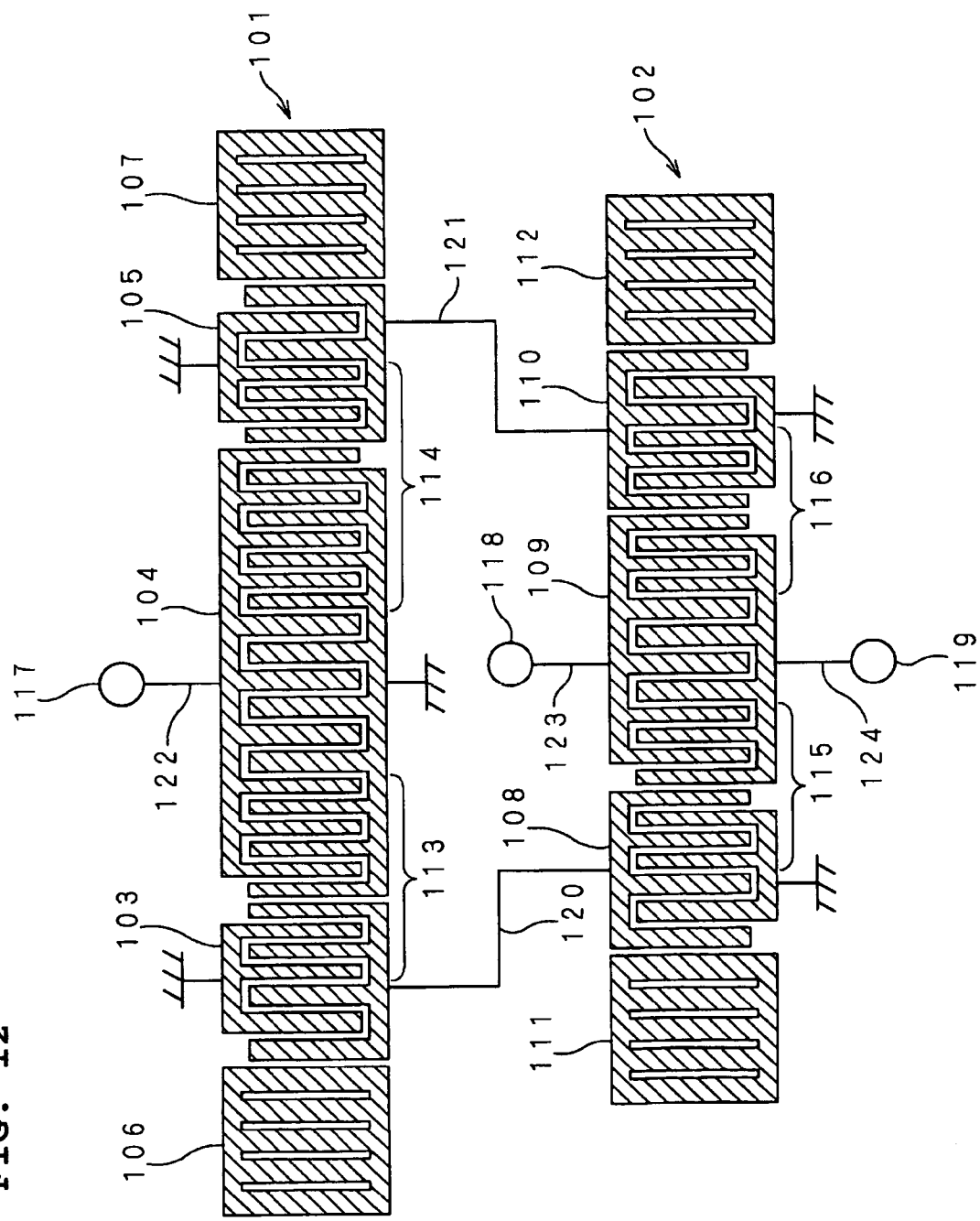
FIG. 12 shows the structure of a surface acoustic wave filter according to a reference example.

As shown in FIG. 12, one filter element 101 includes three IDTs 103, 104, and 105 and two reflectors 106 and 107 disposed along the propagation direction of a surface acoustic wave. The IDTs 103 and 105 are disposed so as to sandwich the middle IDT 104 and the reflectors 106 and 107 are disposed on both sides of the IDTs 103 and 105. One end of the middle IDT 104 is connected to an unbalanced signal terminal 117 by a signal line 122.

In the same manner, the other filter element 102 also includes three IDTs 108, 109, and 110 and two reflectors 111 and 112 disposed along the propagation direction of a surface acoustic wave. The IDTs 108 and 110 are disposed so as to sandwich the middle IDT 109 and the reflectors 111 and 112 are disposed on both sides of the IDTs 108 and 110. Both ends of the middle IDT 109 are connected to balanced signal terminals 118 and 119 by signal lines 123 and 124, respectively.

The two filter elements 101 and 102 are cascade connected. That is, one end of the IDTs 103 and 105 of the filter element 101 is connected to one end of the IDTs 108 and 110 of the other element 102 via signal lines 120 and 121, respectively. The other end of the IDTs 103 and 105 of the filter element 101 and the other end of the IDTs 108 and 110 of the other filter element 102 are grounded, respectively. Moreover, even if the other ends are connected to each other in the same manner as the one ends, instead of being connected to the ground, there is no problem in the operation of the surface acoustic wave filter.

The direction of each of the IDTs 103, 104, 105, 108, 109, and 110 is adjusted such that the phase of an electric signal transmitted on a signal line 120 connected between the IDTs 103 and 108 is approximately 180 degrees different from the phase of an electric signal transmitted on a signal line 121 connected between the IDTs 105 and 110. Thus, excellent amplitude balancing and phase balancing of the surface acoustic wave filter is obtained.

In the portions shown by reference numerals 113 to 116 (hereinafter, referred to as narrow-pitched electrode finger portions) in FIG. 12, that is, in the portions between the IDTs 103 and 104 and between the IDTs 104 and 105 of the filter element 101 and between the IDTs 108 and 109 and between the IDTs 109 and 110 of the filter element 102, the pitch of a few adjacent electrode fingers (width of an electrode finger and space between electrode fingers) is less than that in the other portion of the IDTs 103, 104, 105, 108, 109, and 110. Moreover, in FIG. 12, for simplicity, the number of electrode fingers is illustrated so as to be less than the actual number of electrode fingers. A broad bandpass filter is obtained by reducing the discontinuity at the portions where IDTs that are adjacent to each other to the maximum extent by including such narrow-pitched electrode finger portions 113 to 116, and by adjusting the space between the IDTs 103, 104, 105, 108, 109, and 110.

Figure 13:
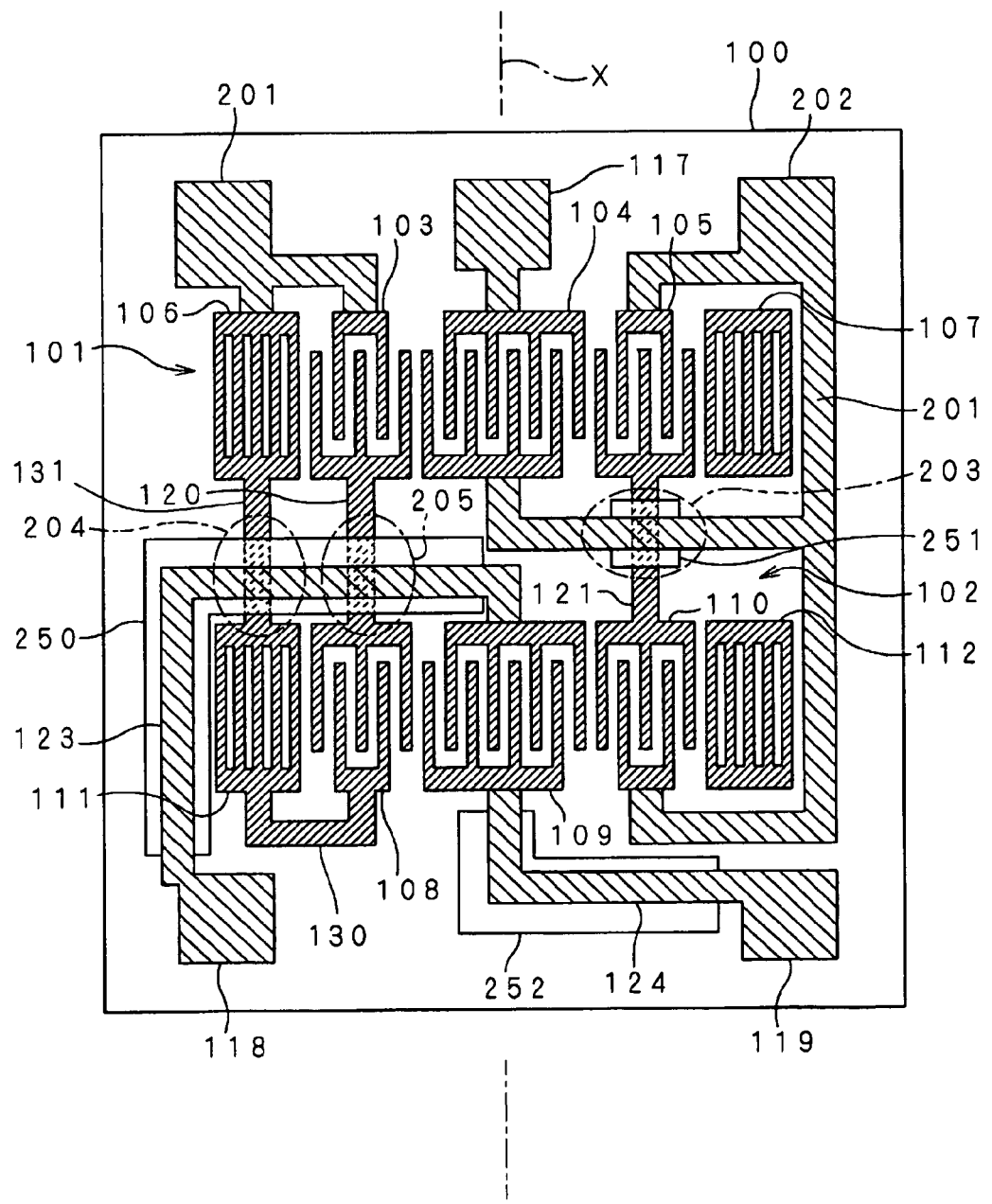
FIG. 13 is a top view of a piezoelectric substrate according to a third preferred embodiment of the present invention.

FIG. 13 shows the actual layout on a piezoelectric substrate 100. In FIG. 13, the oblique line portion having a narrow space is an electrode pattern (hereinafter, referred to as a first layer pattern) formed using a first photolithographic process, for example. The oblique line portion having a wide space is an electrode pattern (hereinafter, referred to as a second layer pattern) formed using a second photolithographic process, for example. The portions having no oblique line 250, 251, and 252 are insulating films formed using a resin having a low dielectric constant before the second layer pattern is formed. In FIG. 13, for brevity, the first layer pattern and the second layer pattern are illustrated so as to be in contact with each other, but actually, at least one of the first layer pattern and the second layer pattern is formed so as to be larger than the illustration in the vicinity of the location where both are in contact with each other and the second layer pattern is disposed on the first layer pattern to connect both.

The unbalanced terminal 117 is disposed in the upper middle portion of the piezoelectric substrate 100 in FIG. 13. The balanced signal terminals 118 and 119 are disposed in the lower left and right portions of the piezoelectric substrate 100 in FIG. 13, respectively. Ground terminals 201 and 202 are disposed in the upper left and right portions of the piezoelectric substrate 100 in FIG. 13, respectively. That is, the balanced signal terminals 118 and 119 are arranged so as to be symmetrical about an imaginary central axis of the piezoelectric substrate 100.

One terminal of the middle IDT 104 of one filter element 101 is connected to the unbalanced terminal 117 and the other terminal is connected to the ground terminal 202. One end of the IDTs 103 and 105 on both sides of one filter element 101 is connected to the ground terminals 201 and 202, respectively, and the other end is connected to one end of the IDTs 108 and 110 of the other filter element 102 through the signal lines 120 and 121, respectively. The connection line for connecting the other end of the middle IDT 104 to the ground terminal 202 intersects the signal line 201 in three dimensions through an insulating film 251 disposed on the signal line 121 for connecting between the IDTs 105 and 110 in the portion shown by reference numeral 203.

The other end of the IDT 108 of the filter element 102 is connected to the ground terminal 201 through the reflectors 111 and 106. That is, the other end of the IDT 108 and the reflector 111 are connected by a connection line 130, the reflectors 106 and 110 are connected by a connection line 131, and the reflector 106 and the ground terminal 201 are connected. The other end of the IDT 110 is connected to the ground terminal 202. One end of the middle IDT 109 is connected to one balanced signal terminal 118 by a signal line 123. The majority of the signal line 123 is disposed on an insulating film 250. The signal line 123 intersects the connection line for connecting the reflectors 106 and 111 in three dimensions through the insulating film 250 in the portion shown by reference numeral 204 and intersects the signal line 120 for connecting between the IDTs 103 and 108 in three dimensions through the insulating film 250 in the portion shown by reference numeral 205. The other end of the IDT 109 is connected to the other balanced signal terminal 119 by a signal line 124. An insulating film 252 is disposed between the signal line 124 and the substrate 100 and the symmetry between the balanced signal terminals is maintained.

Next, the method for forming each pattern on the substrate 100 is described.

First, an aluminum film pattern of a first layer is formed on the substrate 100 by a dry etching method or a lift-off method, for example. The aluminum film pattern of the first layer includes the IDTs 103, 104, and 105; 108, 109, and 110, the reflectors 106 and 107; and 111 and 112, the signal lines 120 and 121, and the connection lines 130 and 131. The thickness of the aluminum film of the first layer is substantially the same in the IDTs 103, 104, and 105; and 108, 109, and 110.

Next, a photosensitive resin is coated on the substrate 100 and the insulating films 250, 251, and 252 are formed using a photolithography method, for example. Polyimide (relative dielectric constant: 2) is used as a photosensitive resin, for example. In this case, since the relative dielectric constant is sufficiently small as compared to the relative dielectric constant of about 50 of the LiTaO$_3$ substrate 100, when the signal lines 123 and 124 connected to the balanced signal terminals 118 and 119 are formed on the insulating films 250 and 251, the stray capacitance is reduced as compared to the case in which a signal line connected to a balanced signal terminal is formed directly on a substrate.

Next, a resist mask having an opening corresponding to the second layer pattern is formed on the substrate 100 and an aluminum film pattern of the second layer is formed using a lift-off method, for example.

Moreover, an adhesive layer of, for example, Ti or NiCr may be formed between the aluminum film of the first layer and the substrate 100 or between the aluminum film of the second layer and the aluminum film of the first layer.

Figure 20:
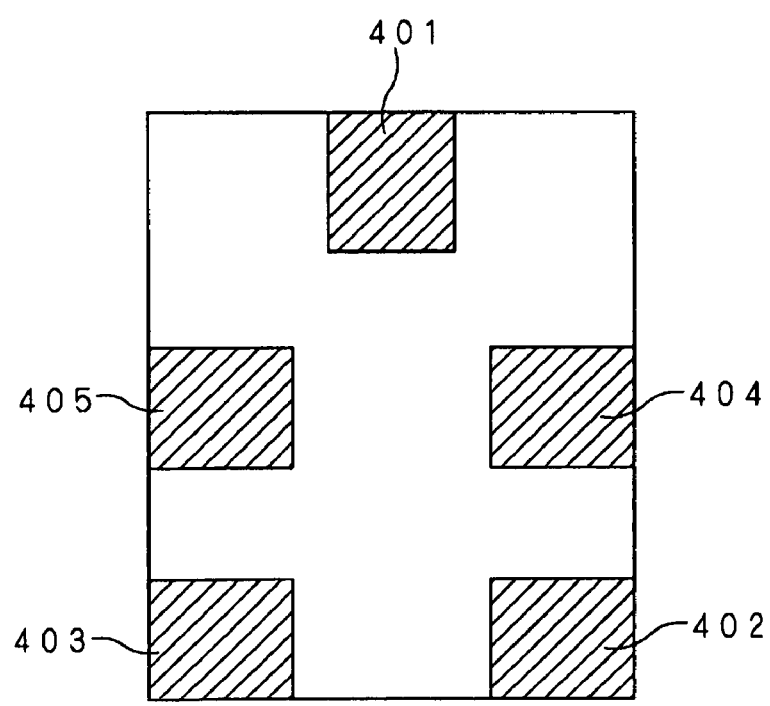
FIG. 20 is a bottom view of a package according to the third preferred embodiment of the present invention.

In FIG. 20, the layout of external terminals 401 to 405 on the bottom surface of a package for the surface acoustic wave filter of the third preferred embodiment is shown. In FIG. 20, the upper middle external terminal 401 is an unbalanced terminal and is connected to the terminal 117 shown in FIGS. 12 and 13. The external terminals 402 and 403 in the lower right and lower left corner portions are balanced signal terminals and are connected to the terminals 118 and 119 shown in FIGS. 12 and 13, respectively. The external terminals 404 and 405 in the middle portions are ground terminals.

Figure 18:
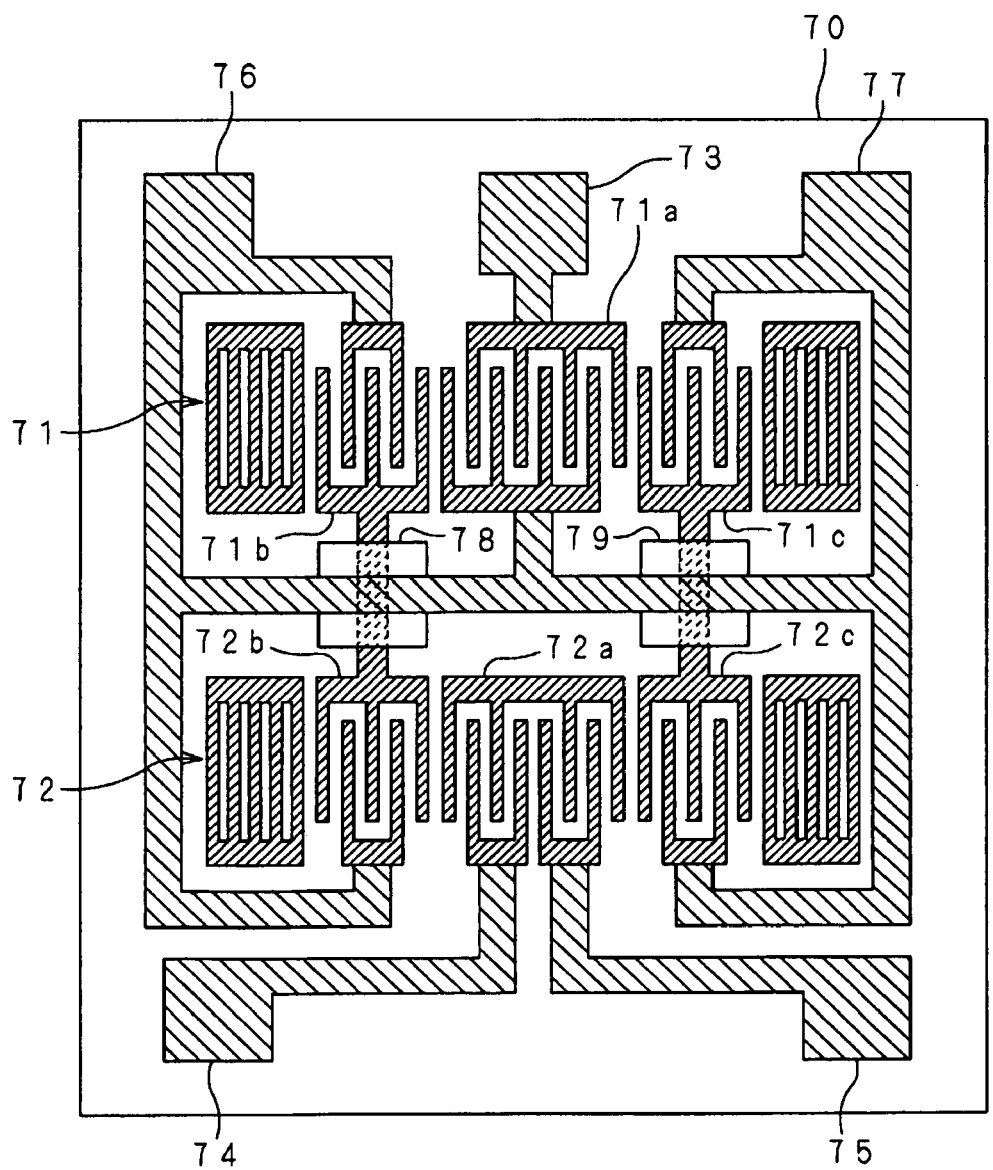
FIG. 18 is a top view of a piezoelectric substrate according to a reference example.
Figure 19:
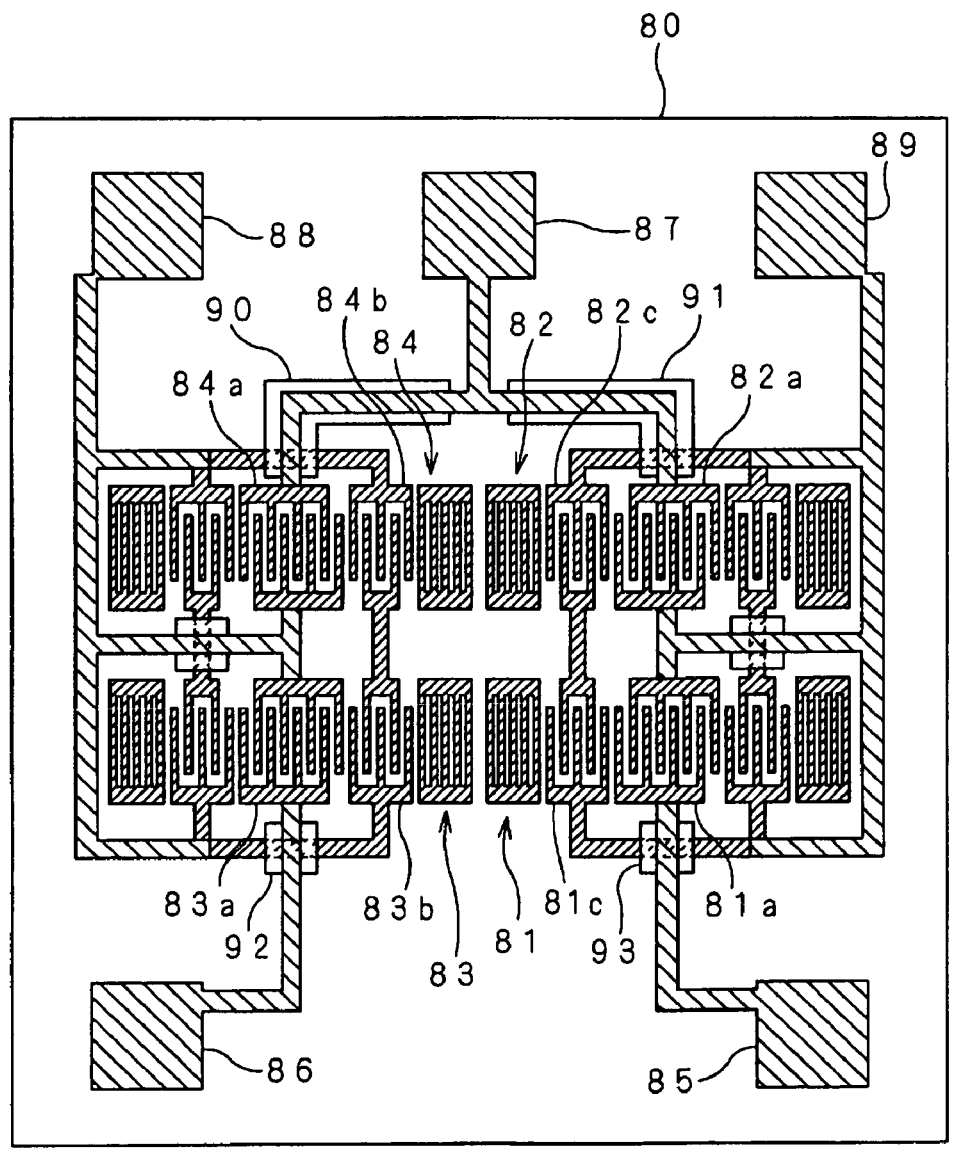
FIG. 19 is a top view of a piezoelectric substrate according to another reference example.

FIGS. 18 and 19 shown surface acoustic wave filter element chips having a balanced-to-unbalanced conversion function with various other configurations in which surface acoustic wave elements 71 and 72, and 81 to 84 are provided on piezoelectric substrates 70 and 80, which are substantially the same size as the piezoelectric substrate 100 so as to be housed in a common package. FIG. 18 corresponds to the structure shown in FIG. 10 and FIG. 19 corresponds to the structure shown in FIG. 11. In the surface acoustic wave filters having a balanced to unbalanced conversion function with the other configurations, in the same manner as the piezoelectric substrate 100 of the third preferred embodiment, unbalanced terminals 73 and 87 are disposed in the upper middle portion of the piezoelectric substrates 70 and 80, balanced signal terminals 74 and 75, and 86 and 85 are disposed in the lower left and right portions, and the ground terminals 76 and 77, 88 and 89 are disposed in the upper left and right portions.

Accordingly, the surface acoustic wave filter of the third preferred embodiment and the surface acoustic wave filters having a balanced-to-unbalanced conversion function with the other configurations as shown in FIGS. 18 and 19 can be housed in a common package.

Moreover, in FIGS. 18 and 19, the first layer pattern, the second layer pattern, and the insulating film pattern are illustrated in the same manner as in FIG. 13. In FIG. 18, the signal lines between the IDTs 71b and 72b and between the IDTs 71c and 72c and the connection line for connecting between the IDT 71a and the second terminals 76 and 77 intersect in three dimensions through insulating films 78 and 79. In FIG. 19, the signal lines for connecting between the IDTs 84a and 82a and the terminal 87 and the connection lines for connecting between the IDTs 84b and 82c and the terminals 88 and 89 intersect in three dimensions through insulating films 90 and 91, and the signal lines for connecting between the IDTs 83a and 81a and the terminals 86 and 85 and the connection lines for connecting between the IDTs 83b and 81c and the terminals 88 and 89 intersect in three dimensions through insulating films 92 and 93.

Next, one example of the design of the surface acoustic wave filter elements 101 and 102 is provided. When the wavelength determined by the pitch of the electrode fingers where the pitch is not narrowed except in narrow-pitched electrode finger portions 113 to 116 is represented by $\lambda_I$, the following relationship is obtained.

Cross width: 48.1 $\lambda_I$

Number of electrode fingers of filter element 101 (in the order of IDTs 103, 104, and 105): 28(6)/(6)24(6)/(6)28 (number of narrow-pitched electrode fingers represented by the number in the parentheses)

Number of electrode fingers of filter element 102 (in the order of IDTs 108, 109, and 110): 28(6)/(3)24(3)/(6) 28 (number of narrow-pitched electrode fingers represented by the number in the parentheses)

Number of reflectors: 80

Metallization ratio: 0.70

Electrode film thickness: 0.080 $\lambda_I$

Figure 14:
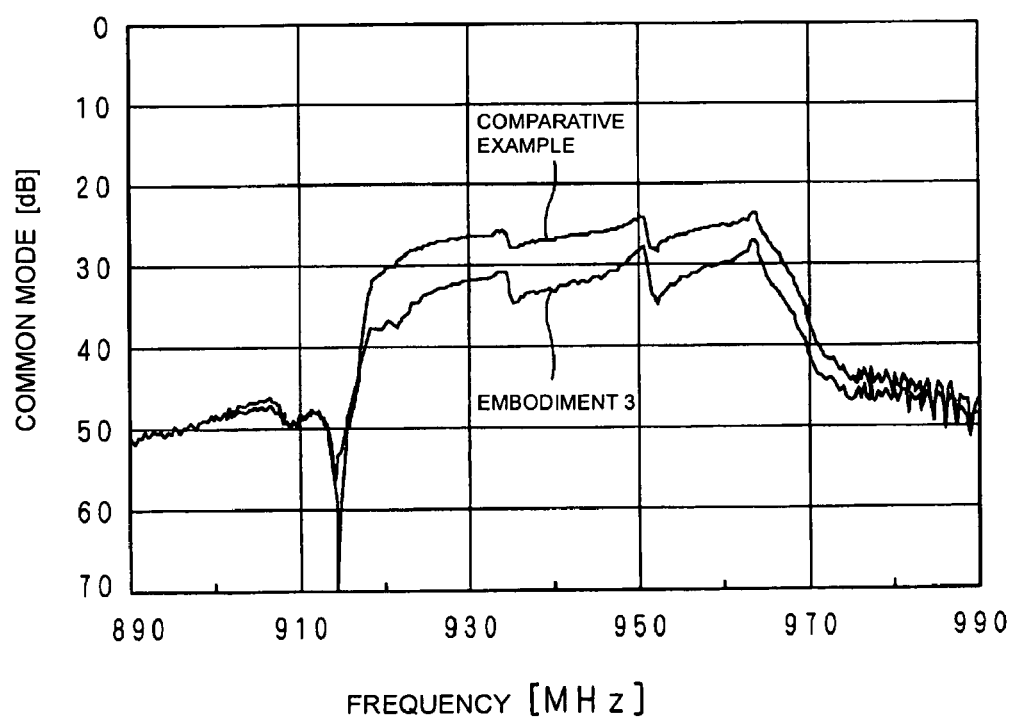
FIG. 14 is a diagram showing characteristics of a surface acoustic wave filter according to the third preferred embodiment of the present invention.

FIG. 14 shows the relationship between the frequency and common-mode attenuation characteristics of the above-described design example (third preferred embodiment). The common-mode attenuation characteristics show the balancing between balanced signal terminals, and that as the attenuation increases, the balancing between balanced signal terminals improves.

Figure 15:
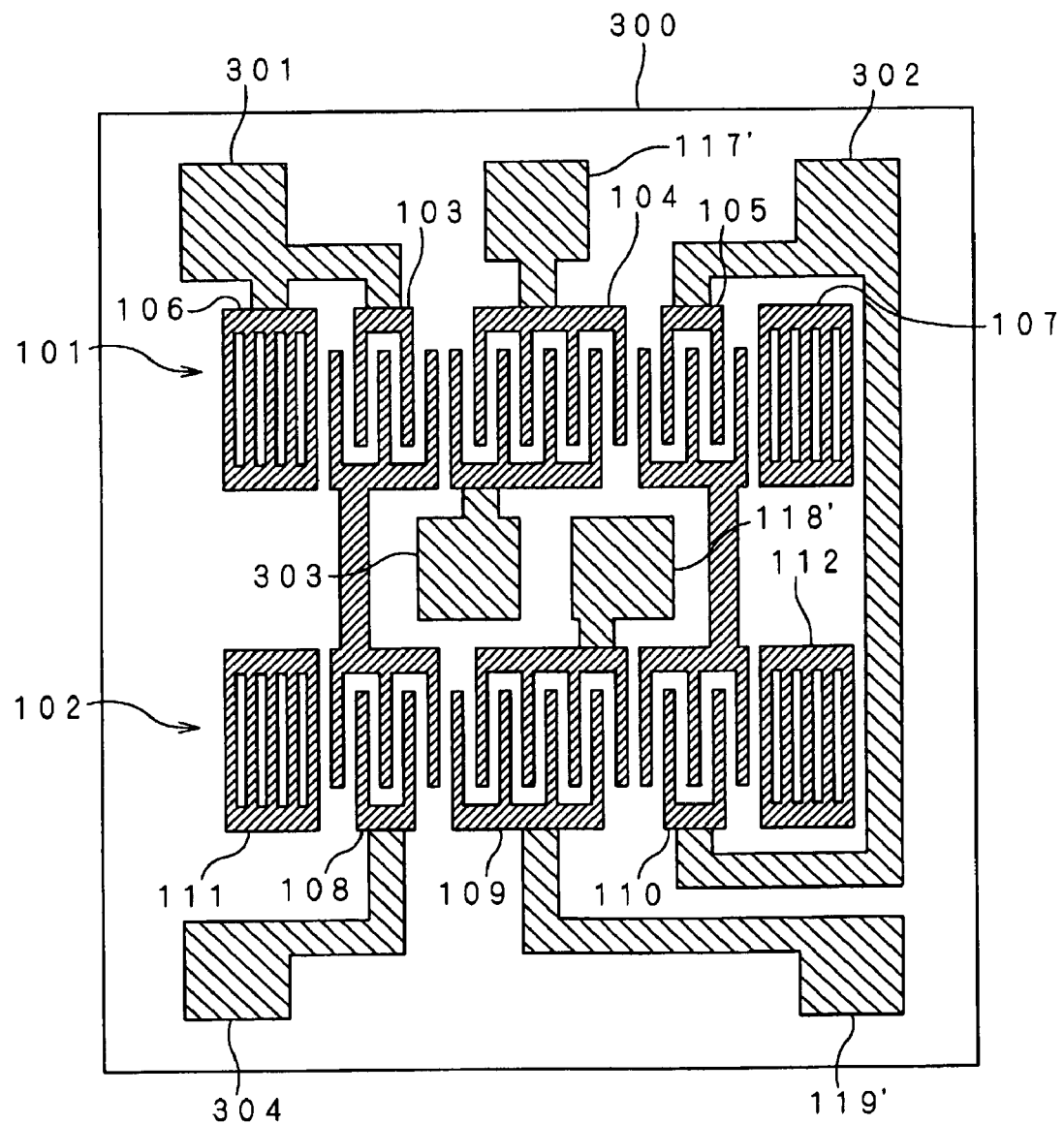
FIG. 15 is a top view of a piezoelectric substrate according to a comparative example.

In FIG. 14, as a comparative example, the relationship between the frequency and common-mode attenuation characteristics where an extra wiring for balanced signal terminals is included inside a package as in Japanese Unexamined Patent Application Publication No. 2002-271168 and the layout of the terminals on the bottom surface of the package is the same as that shown in FIG. 20. The layout on the piezoelectric substrate of the comparative example is shown in FIG. 15. The specification of the filter elements 101 and 102 is the same as that of the above design example (third preferred embodiment). FIG. 15 shows the layout on a piezoelectric substrate 300 in which an unbalanced signal terminal 117' is disposed in the upper middle portion, a balanced signal terminal 118' is disposed on the slightly right side from the middle, and a balanced signal terminal 119' is disposed on the lower right portion. A ground terminal 301 is disposed in the upper left portion, a ground terminal 302 is disposed in the upper right portion, a ground terminal 303 is disposed on the slightly left side from the middle, and a ground terminal 304 is disposed in the lower left portion.

The passband of the EGSM receiving filter is about 925 MHz to about 960 MHz. In FIG. 14, when the greatest common-mode attenuation is compared in the frequency band, although the common-mode attenuation is about 24.0 dB in the comparative example, the common mode attenuation is about 27.5 dB in the preferred embodiment and, as a result, the common mode attenuation improves by about 3.5 dB as compared to the comparative example.

One of the main causes of this effect is that, since the asymmetrical extra wiring connected to the balanced signal terminals in the comparative example is not provided in the preferred embodiment, the difference of the effect of parasitic capacitance is eliminated, and, since, in the preferred embodiment, the signal lines 123 and 124 for connecting between the IDTs and the balanced signal terminals on the piezoelectric substrate are provided on an insulating film pattern made of a resin having a low dielectric constant, even if the lengths of the signal lines 123 and 124 are different from each other on the piezoelectric substrate, the difference of the parasitic capacitance entering each balanced terminal is minimal.

As described above, according to the third preferred embodiment, when the terminals of the middle IDT in the three IDTs in a longitudinally coupled resonator-type surface acoustic wave filter having three IDTs are connected to balanced signal terminals, a filter having an greatly improved balancing between the balanced signal terminals is obtained. Furthermore, the above-described surface acoustic wave filter and a surface acoustic wave filter having a balanced to unbalanced conversion function of another configuration can be housed in a common package.

Next, fourth to seventh preferred embodiments are described. The fourth to seventh preferred embodiments achieve the same effects as those achieved in the third preferred embodiment. Hereinafter, the differences between the fourth to seventh preferred embodiments and the third preferred embodiment are primarily described.

Fourth Preferred Embodiment

Figure 16:
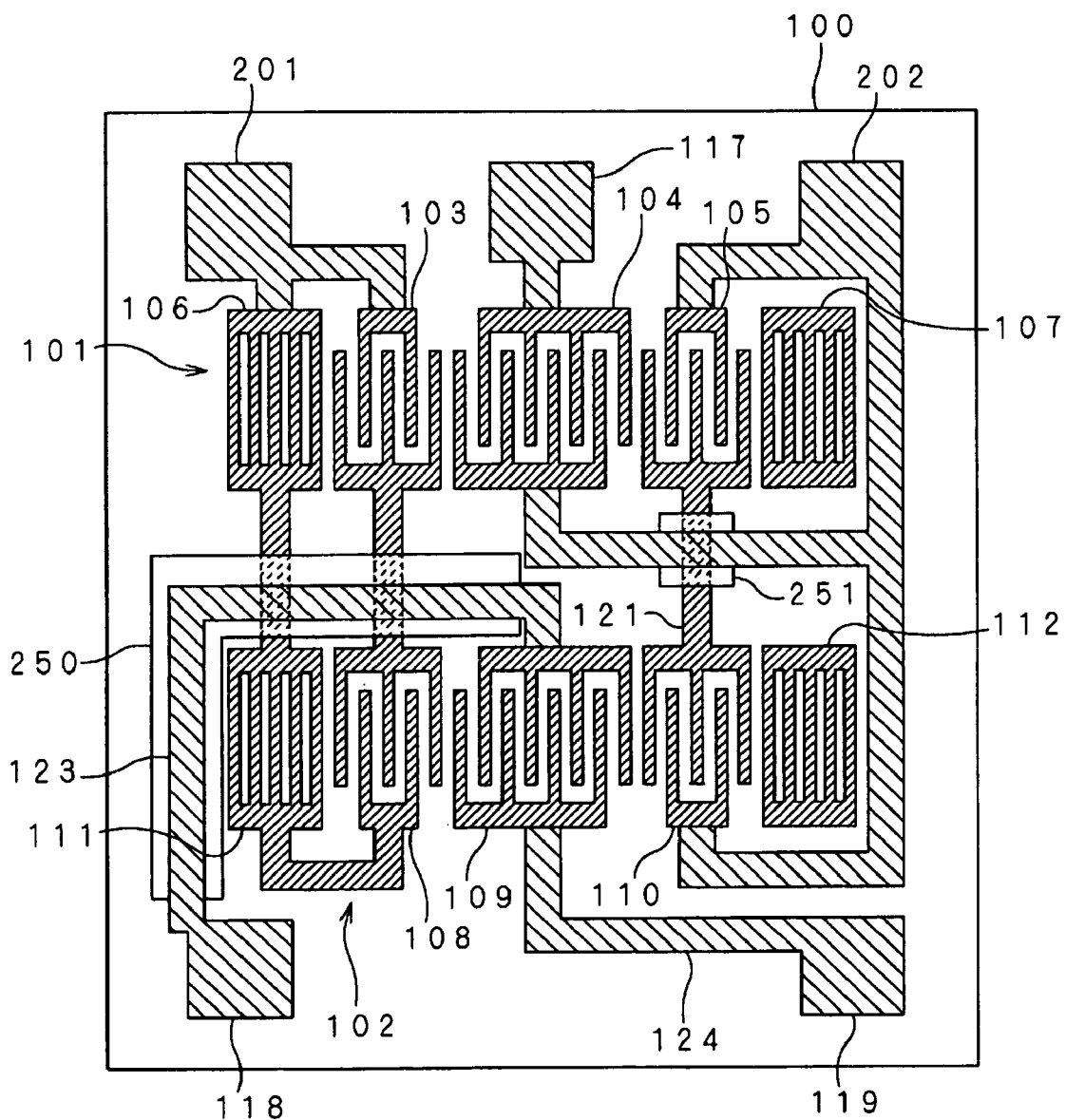
FIG. 16 is a top view of a piezoelectric substrate according to a fourth preferred embodiment of the present invention.

The signal lines 123 and 124 are disposed on the insulating films 250 and 251 in the third preferred embodiment. However, in the fourth preferred embodiment, as shown in FIG. 16, only the longer signal line 123 is disposed on the insulating film 250.

Fifth Preferred Embodiment

Figure 17:
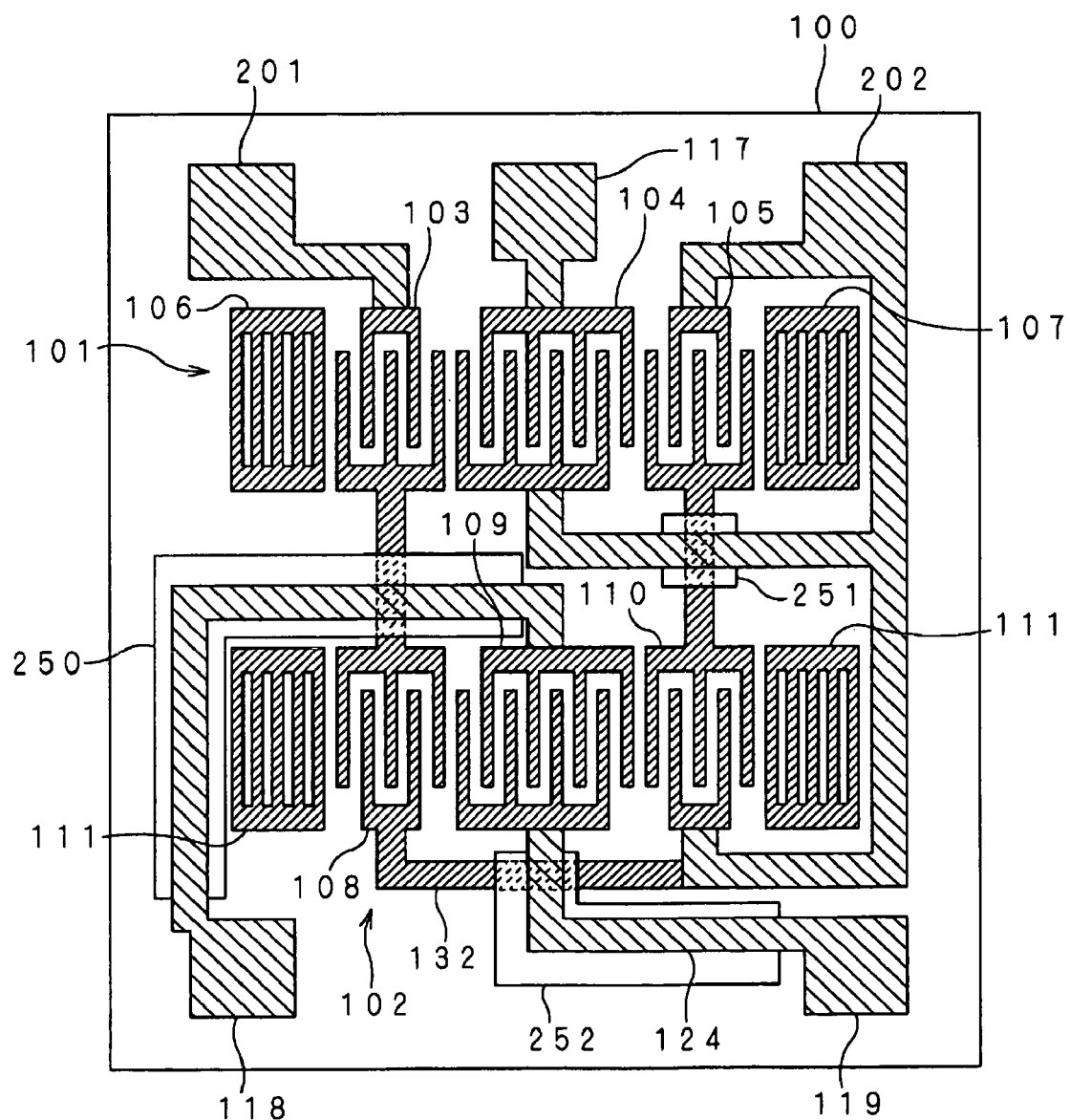
FIG. 17 is a top view of a piezoelectric substrate according to a fifth preferred embodiment of the present invention.

As shown in FIG. 17, the connecting method between the IDT 108 and the ground terminal is different from that in the third preferred embodiment. That is, there is no connecting line for connecting between the IDT 108 and the reflector 111, between the reflectors 106 and 111, and between the reflector 106 and the ground terminal 201. Instead, for connecting to the ground terminal 202, a connection line 132 for connecting to the IDT 108 is defined by the first layer pattern. The connection line 132 is connected to a connection line of the second layer pattern for connecting between the IDT 110 and the ground terminal 202. The insulating film 252 is provided on the connection line 132 and intersects the signal line 124 for connecting between the middle IDT 109 and a balanced signal terminal 119 in three dimensions.

Sixth Preferred Embodiment

Figure 21:
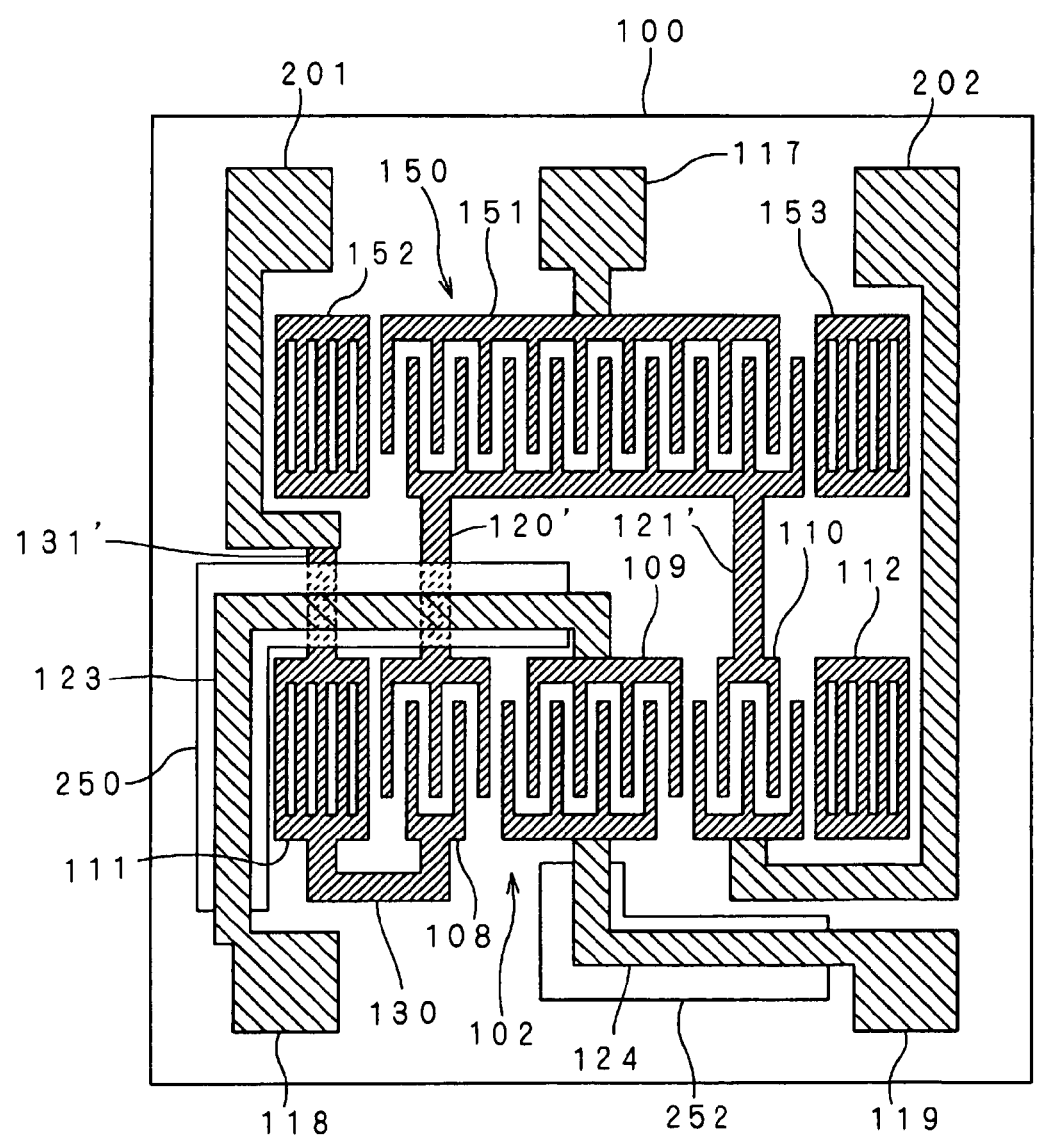
FIG. 21 is a top view of a piezoelectric substrate according to a sixth preferred embodiment of the present invention.
Figure 22:
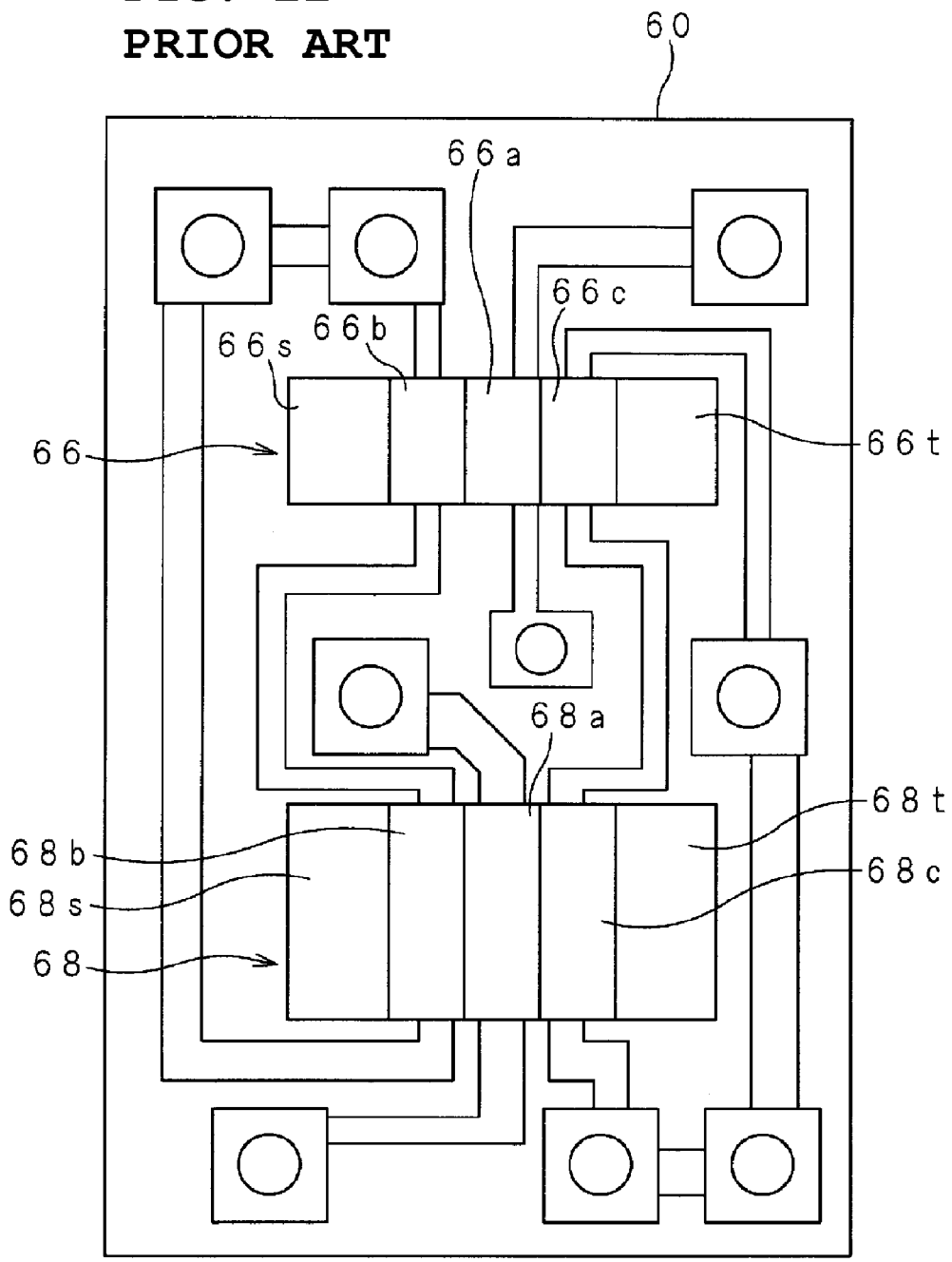
FIG. 22 is a top view of a piezoelectric substrate according to the related art.

As shown in FIG. 21, a surface acoustic wave resonator element (hereinafter, referred to as a resonator element) 150 is connected in series to the filter element 102. Also in this case, the attenuation outside the passband is increased in the same manner as in the third to fifth preferred embodiments in which the two longitudinally coupled resonator-type surface acoustic wave filter elements are cascade connected.

In the resonator element 150, reflectors 152 and 153 are disposed on both sides of an IDT 151. One end of the IDT 151 is connected to an unbalanced signal terminal 117 and the other end is connected to one ends of the IDTs 108 and 110 of the filter element 102 by signal lines 120' and 121'.

The pattern of the first layer includes the filter element 102, the resonator element 150, the signal lines 120' and 121', the connection line 130 between the IDT and the reflector 111, and a connection line 131' extending from the reflector 111 to the middle on the side of the resonator element 150. The connection line 131' extending to the middle on the side of the resonator element 150 is connected to the ground terminal 201 by the connection line of the second layer pattern. The signal line 123 for connecting between the IDT 109 of the filter element 102 and the balanced terminal 118 intersects the signal line 120' and the connection line 131' in three dimensions through the insulating film 250.

In the resonator element 150, one end of the IDT 151 is connected to the ground terminal 201 or 202, the other end connected to the filter 102 is connected to the unbalanced terminal 117 by the signal lines 120' and 121', and the resonator element 105 may be connected in parallel to the filter element 102.

Furthermore, in the resonator 150, a plurality of resonator elements may be connected in series or in parallel.

Seventh Preferred Embodiment

Figure 23:
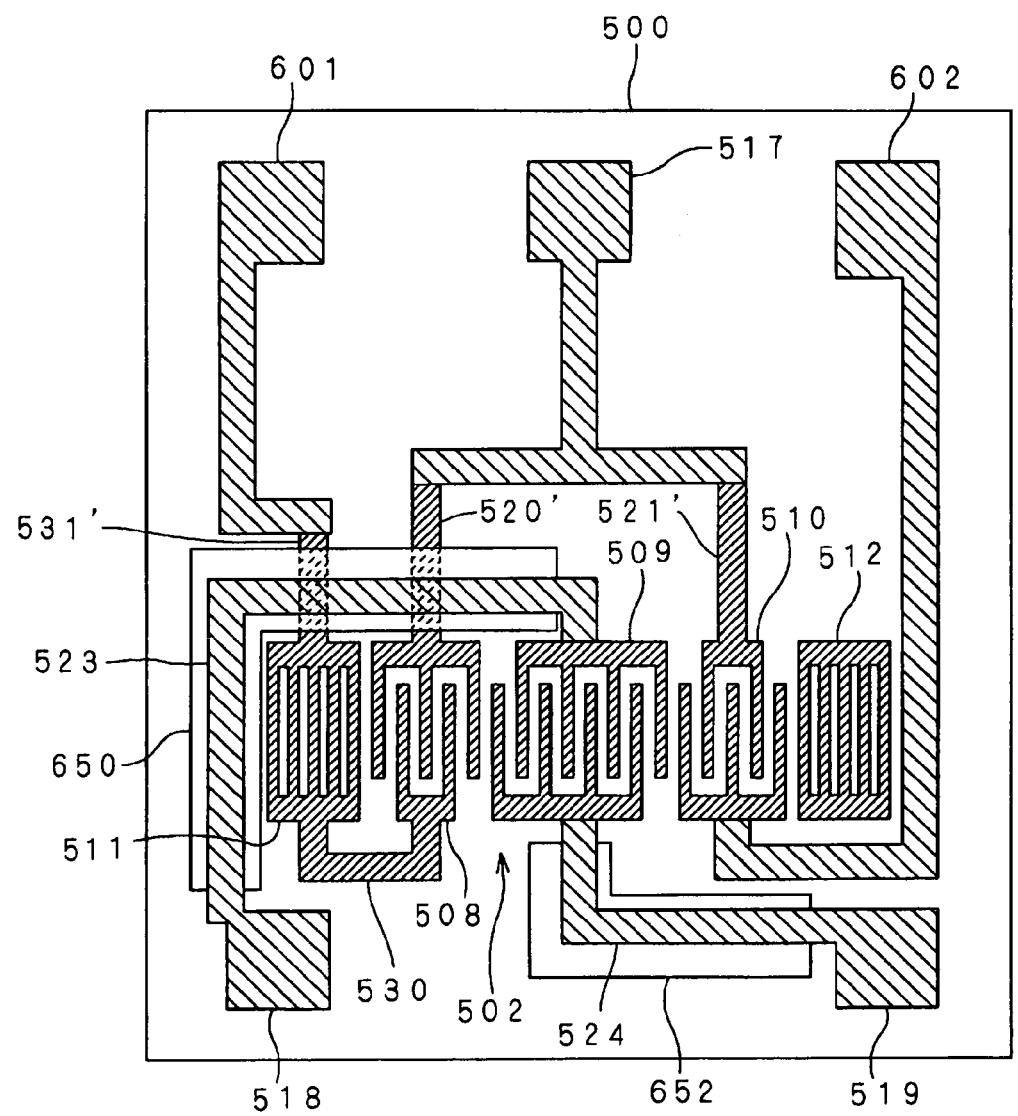
FIG. 23 is a top view of a piezoelectric substrate according to a seventh preferred embodiment of the present invention.

As shown in FIG. 23, only one filter element 502 is disposed on a piezoelectric substrate 500. Also in this case, a filter having greatly improved balancing between balanced signal terminals 518 and 519 is obtained in the same manner as in the third through sixth preferred embodiments. Furthermore, the filter and a surface acoustic wave filter having a balanced to unbalanced conversion function of another configuration can be housed in a common package.

The filter element 502 includes reflectors 511 and 512 on both sides of three IDTs 508, 509, and 510. One end of the IDT 508 is connected to a signal line 520' and one end of the IDT 510 is connected to a signal line 521'. The signal lines 520' and 521' are connected to an unbalanced terminal 517 by a connection line of the second layer pattern.

The pattern of the first layer includes the filter element 502, the signal lines 520' and 521', and a connection line 530 for connecting between the other end of the IDT 508 and the reflector 511. A connection line 531' extending to the middle from the reflector 511 is connected to a ground terminal 601 by the connection line of the second layer pattern. The other end of the IDT 510 is connected to a ground terminal 602 by the connection line of the second layer pattern. A signal line 523 for connecting between one end of the IDT 509 of the filter element 502 and one balanced terminal 518 intersects the signal line 520' and the connection line 531' in three dimensions through an insulating film 650. An insulating film 652 is also provided between a signal line 524 for connecting between the other end of the IDT 509 of the filter element 502 and the other balanced terminal 519 and the piezoelectric substrate 500.

As described above, in the surface acoustic wave filter of the third to seventh preferred embodiments, since the layout of each terminal (bump) disposed on the piezoelectric substrate can be made substantially the same as each terminal (bump) in the element chip of a surface acoustic wave filter of another configuration, the above-described surface acoustic wave filter and the surface acoustic wave filter of another configuration can be housed in a common package.

Furthermore, since the differences in the routes between signal lines in an element chip are substantially reduced by providing signal lines connected to balanced signal terminals on an insulating film pattern provided on a piezoelectric substrate, balancing is greatly improved without providing the different routes in a package.

According to the first to seventh preferred embodiments, characteristics of a surface acoustic wave device are greatly improved.

Moreover, the present invention is not limited to the above-described preferred embodiments, and various modifications can be made.

For example, other than $LiTaO_3$, a single crystal substrate of quartz, $LiNbO_3$, or other suitable material can be used as a substrate. Furthermore, the present invention can be applied to a surface acoustic wave device using a piezoelectric thin film of ZnO, AlN, or other suitable piezoelectric thin film.

For example, although a 40±5° Y-cut X-propagation LiTaO$_3$ substrate is used in the third to seventh preferred embodiments, in the present invention, the substrate is not limited thereto, and the same effect can be obtained by using a substrate of 64 to 72° Y-cut X-propagation LiNbO$_3$, 41° Y-cut X-propagation LiNbO$_3$, or other suitable substrate.

Furthermore, the present invention can be applied to not only a surface acoustic wave filter having a balanced-to-unbalanced conversion function, but also to a surface acoustic wave filter having a balanced-to-balanced conversion function.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. A surface acoustic wave device comprising:
   a substrate;
   a plurality of terminals disposed on the substrate and including at least an unbalanced terminal and two balanced terminals;
   at least two surface acoustic wave elements disposed on the substrate between the unbalanced terminal and the balanced terminals; and
   a plurality of signal lines connected to the at least two surface acoustic wave elements; wherein
   at least two of the plurality of signal lines connected to the at least two surface acoustic wave elements intersect one another with an insulating film disposed therebetween;
   one of the at least two surface acoustic wave elements defines a first element that is connected to the unbalanced terminal and to a ground pad;
   another of the at least two surface acoustic wave elements defines a second element;
   at least two of the plurality of signal lines define signal wirings arranged to connect the second element to the first element;
   at least one of the plurality of signal lines defines a ground wiring arranged to connect the first element to the ground pad;
   at least one of the signal wirings and the ground wiring intersect with the insulating film disposed therebetween;
   the ground pad is disposed outside of an area enclosed by the first element, the second element and the signal wirings; and
   the ground wiring includes a first layer which is not disposed in the vicinity of the insulating film and a second layer which is disposed in the vicinity of the insulating film.

2. The surface acoustic wave device as claimed in claim 1, wherein the insulating film is polyimide.

3. The surface acoustic wave device as claimed in claim 1, wherein
   the first element includes three IDTs disposed in a propagation direction of a surface acoustic wave, and the unbalanced terminal and the ground pad are connected to a middle IDT of the three IDTs;
   the second element includes three IDTs arranged in the propagation direction of the surface acoustic wave, and the two balanced terminals are connected to a middle IDT of the three IDTs; and
   the IDTs on either side of the middle IDT of the first element and the IDTs on either side of the middle IDT of the second element are connected by the signal wirings.

4. The surface acoustic wave device as claimed in claim 1, wherein
   two sets of the first element, the signal wirings, and the second element are provided on the substrate;
   the first element of each set includes three IDTs disposed in a propagation direction of a surface acoustic wave, and the unbalanced terminal and the ground pad are connected to a middle IDT of the three IDTs;
   the second element of each set includes one IDT connected to one of the balanced terminals that is different from that in the other set;
   in each set, the two signal wirings connect the IDTs on either side of the middle IDT of the first element and the IDT of the second element; and
   the first elements of the two sets are opposite in phase with respect to each other.

5. The surface acoustic wave device as claimed in claim 1, wherein
   the at least two surface acoustic wave elements are connected to each other;
   the first element is a longitudinally coupled resonator-type surface acoustic wave element having three IDTs disposed along a propagation direction of a surface acoustic wave, and the middle IDT of the three IDTs is connected to the two balanced signal terminals through first and second signal lines of the plurality of signal lines;
   the two balanced signal terminals are disposed on either side of a central axis of the substrate substantially in parallel to the direction in which the at least two surface acoustic wave elements are arranged; and
   at least one of the first and second signal lines is disposed on the insulating film.

6. The surface acoustic wave device as claimed in claim 5, wherein the two balanced signal terminals are disposed so as to be substantially symmetrical about the central axis of the substrate.

7. The surface acoustic wave device as claimed in claim 5, wherein the second surface acoustic wave element is disposed in the propagation direction of a surface acoustic wave and is a longitudinally coupled resonator-type surface acoustic wave filter element having three IDTs cascade-connected connected to the first surface acoustic wave element.

8. The surface acoustic wave device as claimed in claim 5, wherein the second element includes one surface acoustic wave resonator element.

9. The surface acoustic wave device as claimed in claim 5, wherein the second element includes a plurality of surface acoustic wave resonator elements connected together.

10. The surface acoustic wave device as claimed in claim 1, wherein
    one of the at least two surface acoustic wave element is a longitudinally coupled resonator-type surface acoustic wave filter element including three IDTs disposed along a propagation direction of a surface acoustic wave, and a middle IDT of the three IDTs is connected to the two balanced terminals through first and second signal lines of the plurality of signal lines;
    the balanced signal terminals are disposed on both sides of a central axis of the substrate substantially perpendicular to the propagation direction of a surface acoustic wave; and
    at least one of the first and second signal lines is disposed on the insulating film.

11. The surface acoustic wave device as claimed in claim 1, wherein the substrate is a $LiTaO_3$ single crystal piezoelectric substrate.

12. The surface acoustic wave device as claimed in claim 1, wherein the substrate is a $LiTaO_3$ 40±5° Y-cut X-propagation substrate.

13. The surface acoustic wave device as claimed in claim 1, wherein the first and second layers of the ground wiring are made of Al.

14. The surface acoustic wave device as claimed in claim 13, wherein an adhesive layer is disposed between the first and second layers of the ground wiring.

15. The surface acoustic wave device as claimed in claim 14, wherein the adhesive layer is made of one of Ti and NiCr.

* * * * *